(12) United States Patent
Murooka

(10) Patent No.: US 8,681,532 B2
(45) Date of Patent: Mar. 25, 2014

(54) RESISTANCE CHANGE MEMORY

(71) Applicant: Kabushiki Kaisha Toshiba, Minato-ku (JP)

(72) Inventor: Kenichi Murooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/937,274

(22) Filed: Jul. 9, 2013

(65) Prior Publication Data

US 2013/0294147 A1    Nov. 7, 2013

Related U.S. Application Data

(63) Continuation of application No. 13/072,029, filed on Mar. 25, 2011, now Pat. No. 8,498,142, which is a continuation of application No. PCT/JP2008/068395, filed on Oct. 9, 2008.

(51) Int. Cl.
*G11C 11/00* (2006.01)

(52) U.S. Cl.
USPC .......................................... 365/148; 365/163

(58) Field of Classification Search
USPC .......................................... 365/148, 163, 157
See application file for complete search history.

(56) References Cited

U.S. PATENT DOCUMENTS

| | | | |
|---|---|---|---|
| 7,099,180 B1 * | 8/2006 | Dodge et al. ................... | 365/148 |
| 7,535,756 B2 | 5/2009 | Lung | |
| 8,295,077 B2 | 10/2012 | Murooka | |
| 2006/0227592 A1 * | 10/2006 | Parkinson et al. ............. | 365/148 |

FOREIGN PATENT DOCUMENTS

WO    WO 2008/035392 A1    3/2008

OTHER PUBLICATIONS

Japanese International Search Report mailed Mar. 17, 2009 in PCT/JP2008/068395 filed Oct. 9, 2008 (w/English Translation).
Japanese Written Opinion issued Mar. 17, 2009 in PCT/JP2008/068395 filed Oct. 9, 2008.
Shinichiro Kimura, "Semiconductor Memory; DRAM", ULSI Research Department, Central Research Laboratory, vol. 69, No. 10, 2000, pp. 1233-1240.
Natsuo Ajika, "Flash memory, recent topics", Mitsubishi Electric Corporation, Semiconductor Group, Memory IC Division, Memory Process Design Department, vol. 69, No. 12, 2000, pp. 1462-1466.
International Preliminary Report on Patentability and Written Opinion issued Jun. 16, 2011, in International Application No. PCT/JP2008/068395 (translation only).

* cited by examiner

*Primary Examiner* — Vu Le
(74) *Attorney, Agent, or Firm* — Oblon, Spivak, McClelland, Maier & Neustadt, L.L.P.

(57) ABSTRACT

A memory includes memory cells each includes a resistance change element and a diode, and each memory cell between one of row lines and one of column lines, a first decoder which selects one of the row lines as a selected row line, a second decoder which selects one of the column lines as a selected column line, a voltage pulse generating circuit which generates a voltage pulse, a voltage pulse shaping circuit which makes a rise time and a fall time of the voltage pulse longer, and a control circuit which applies the voltage pulse outputting from the voltage pulse shaping circuit to unselected column lines except the selected column line, and which applies a fixed potential to unselected row lines except the selected row line, in a data writing to a memory cell which is provided between the selected row line and the selected column line.

27 Claims, 21 Drawing Sheets

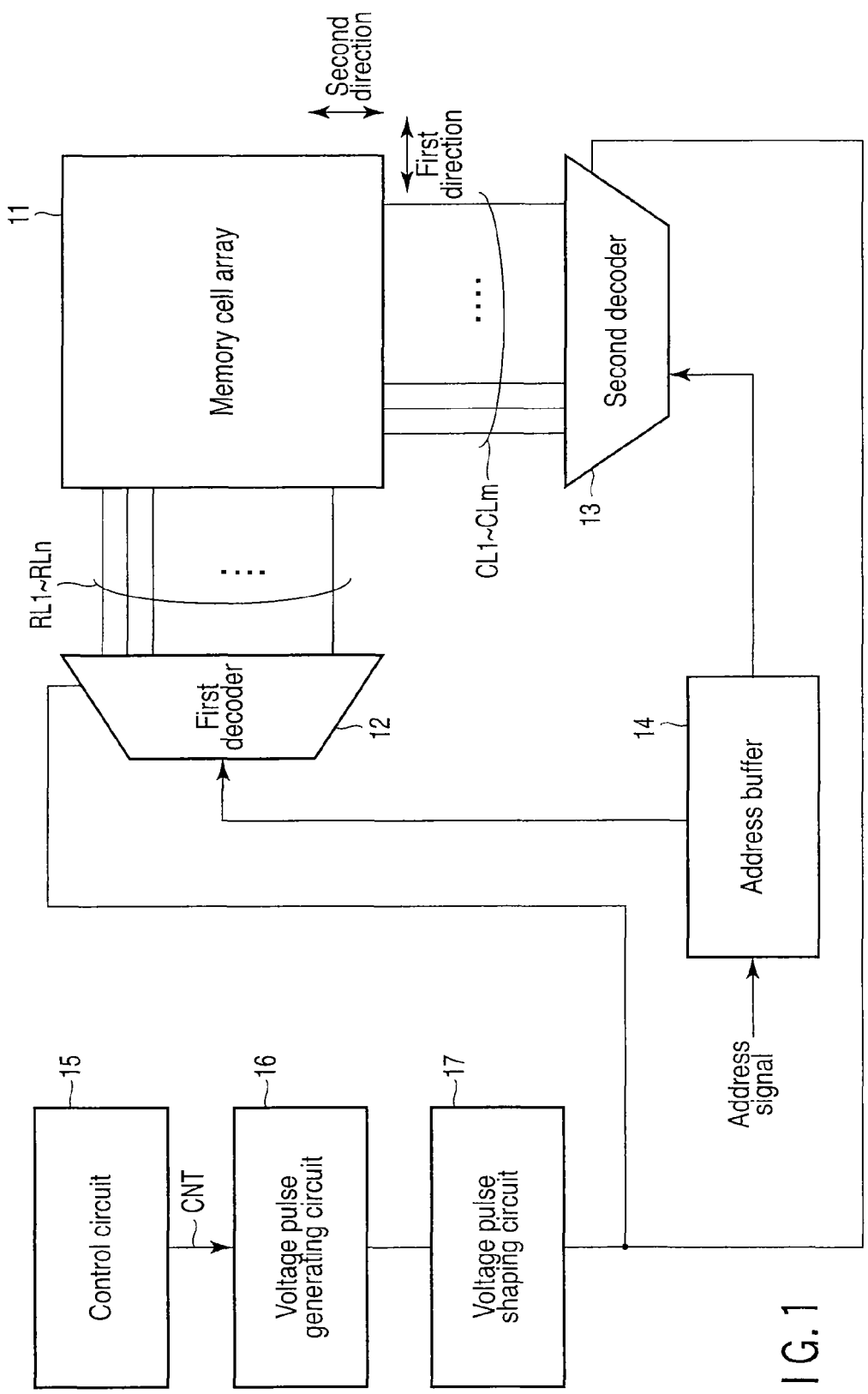
F I G. 1

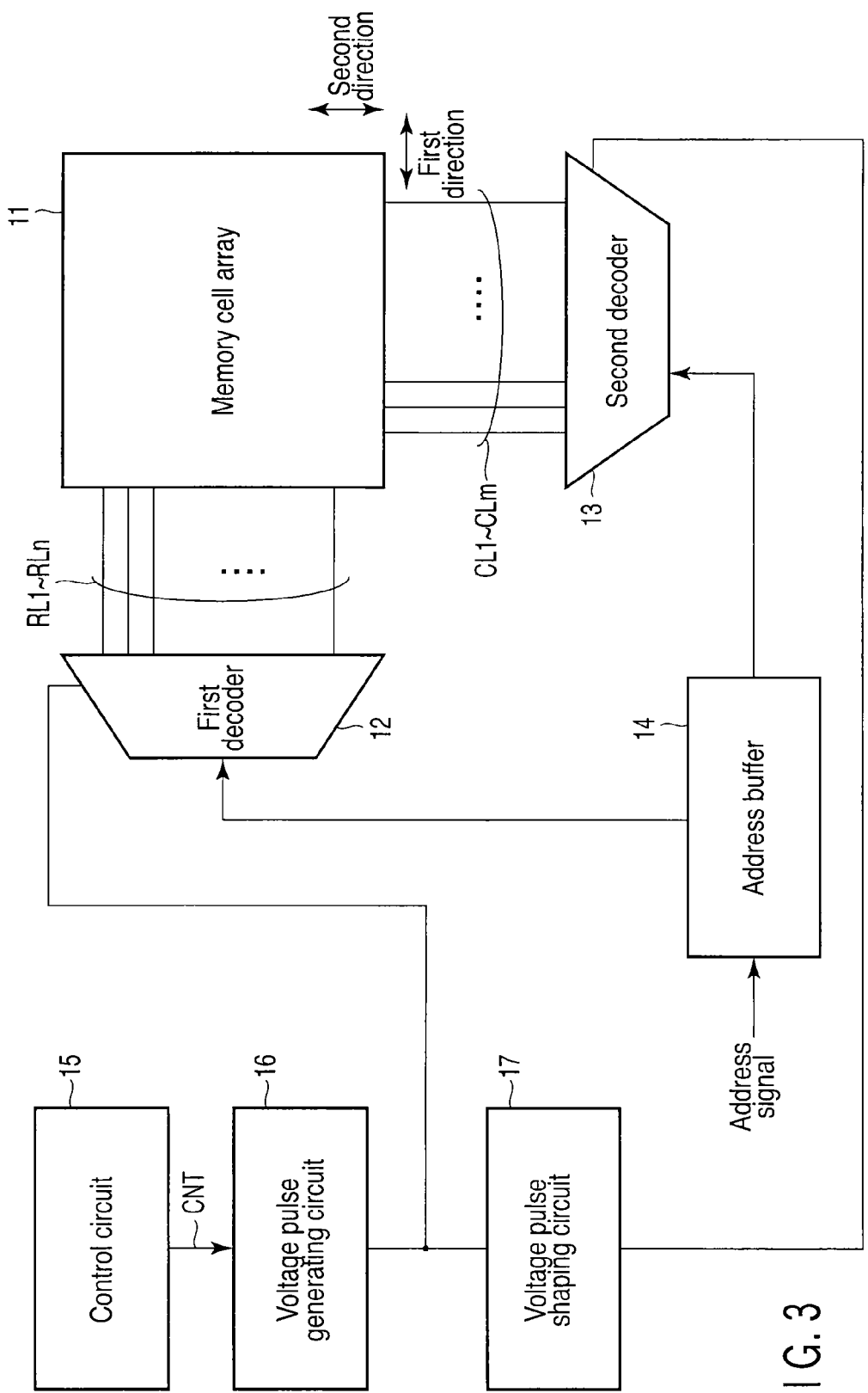
F I G. 3

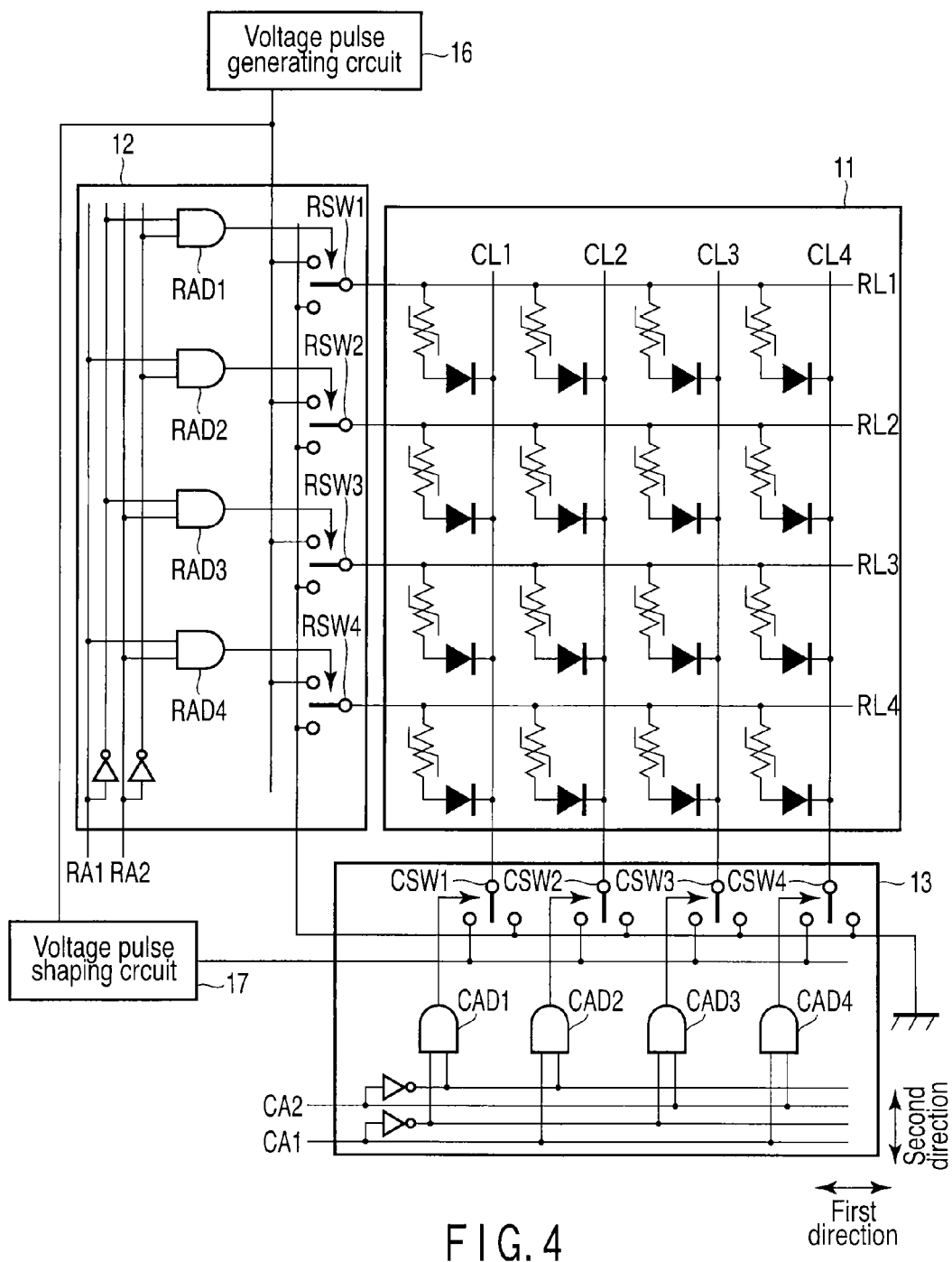
F I G. 4

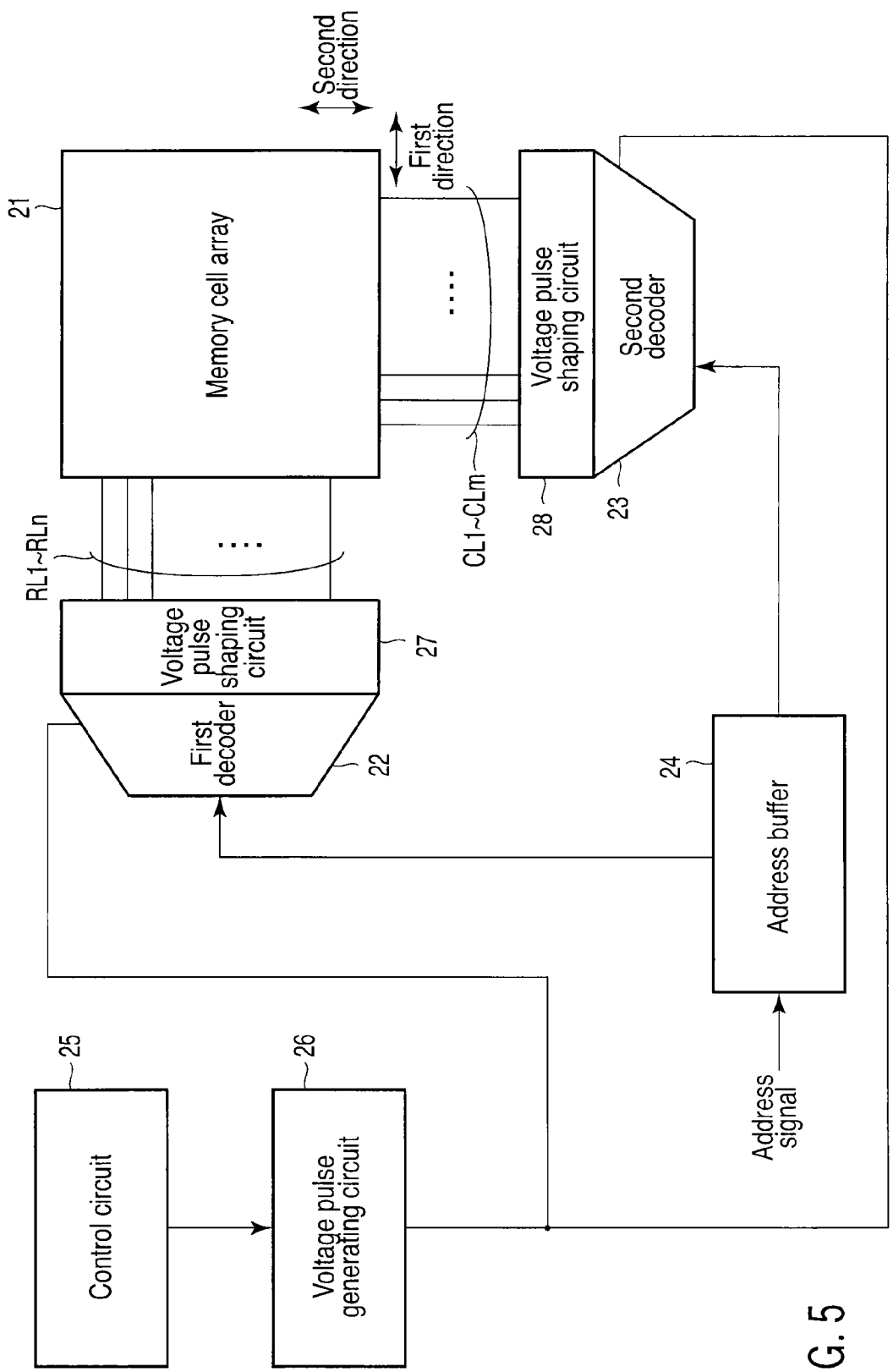
F I G. 5

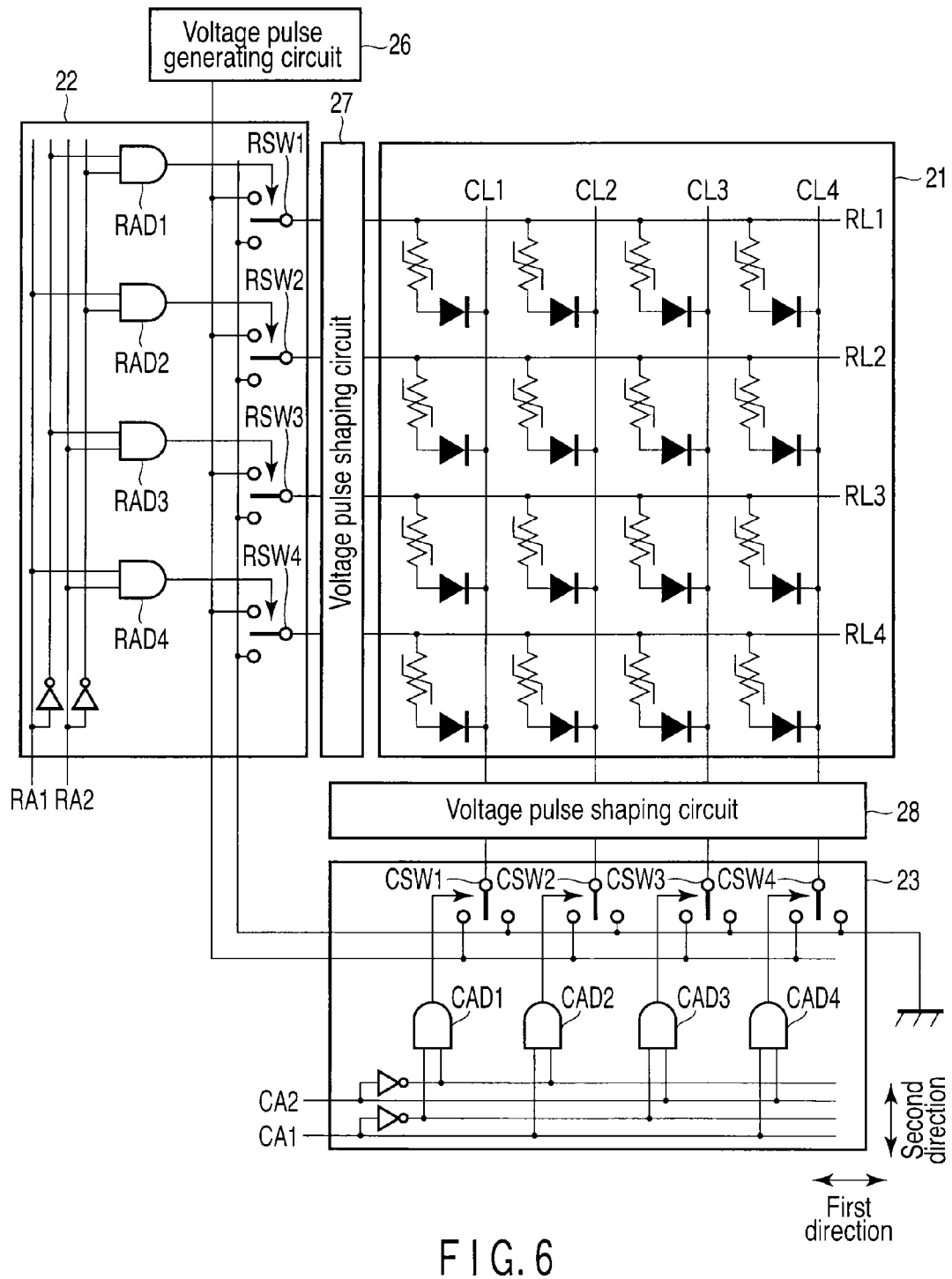
F I G. 6

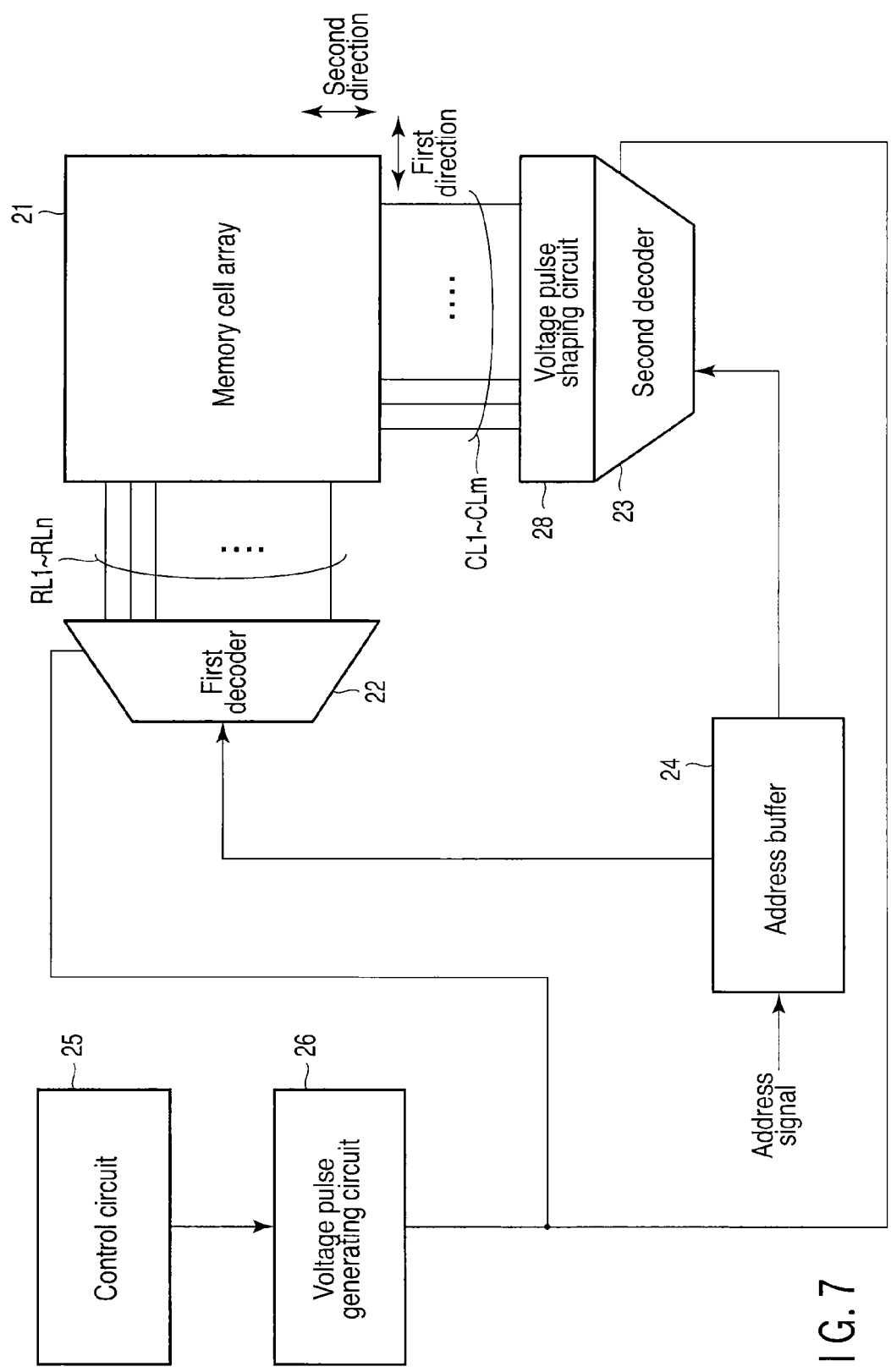
F I G. 7

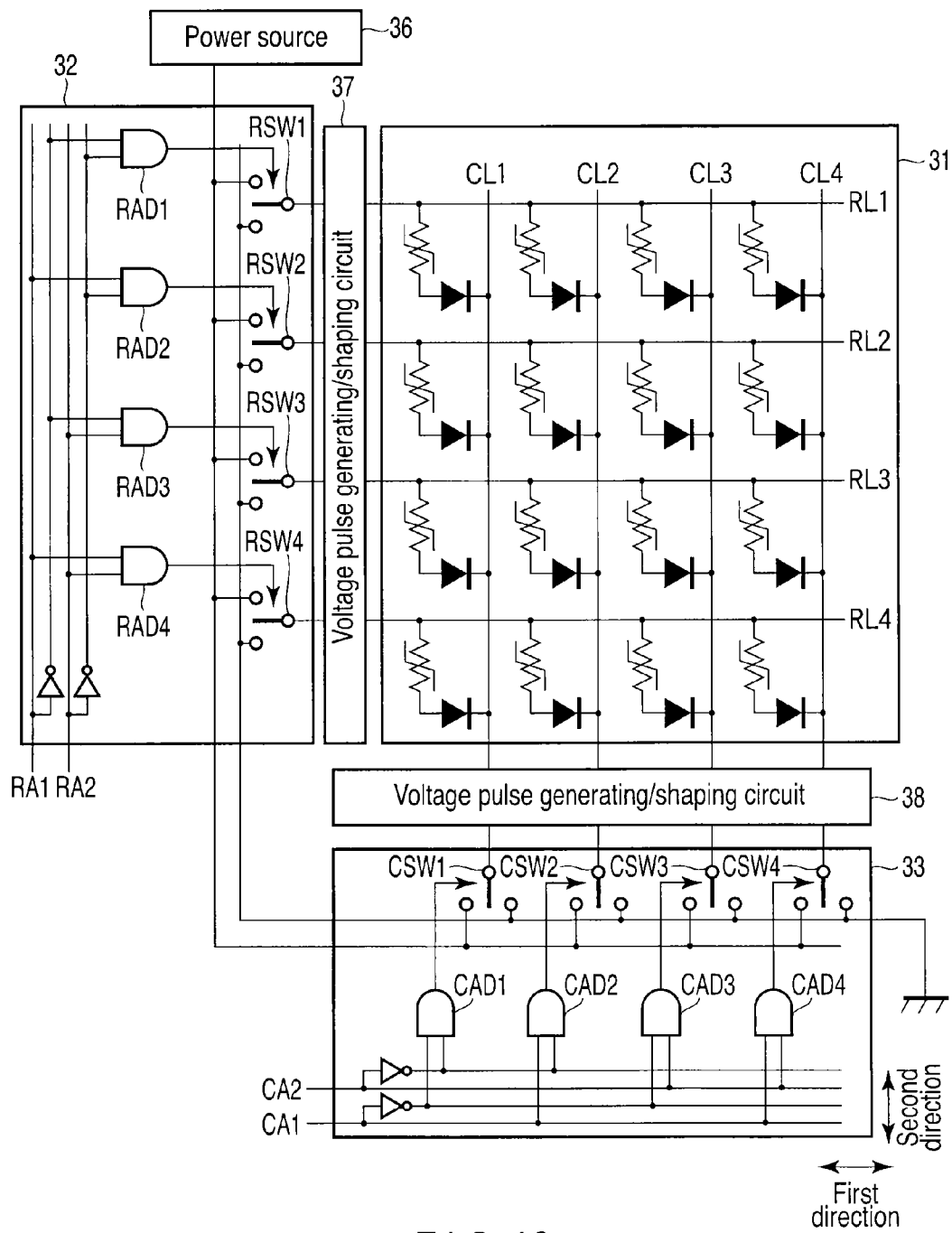
F I G. 10

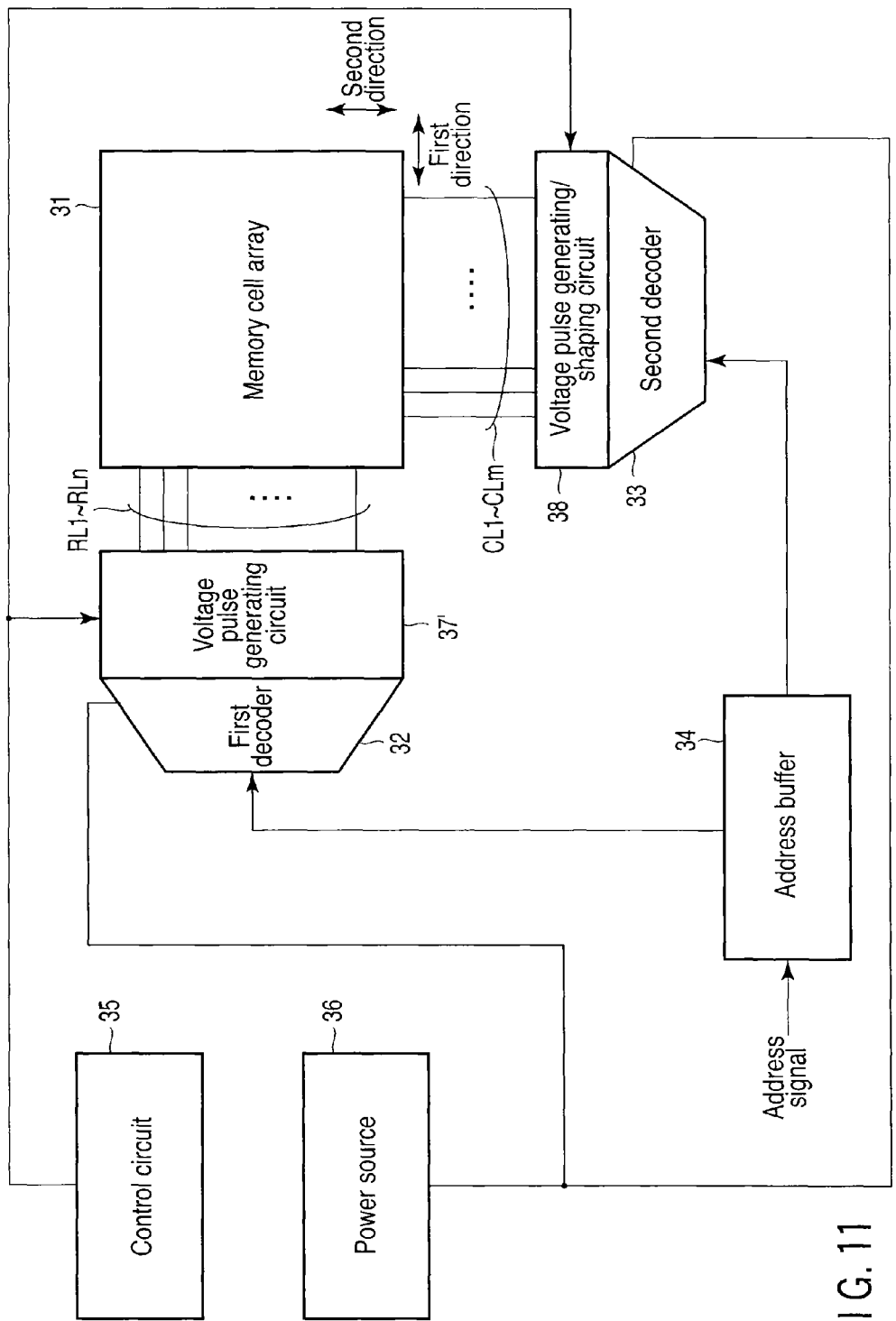
F I G. 11

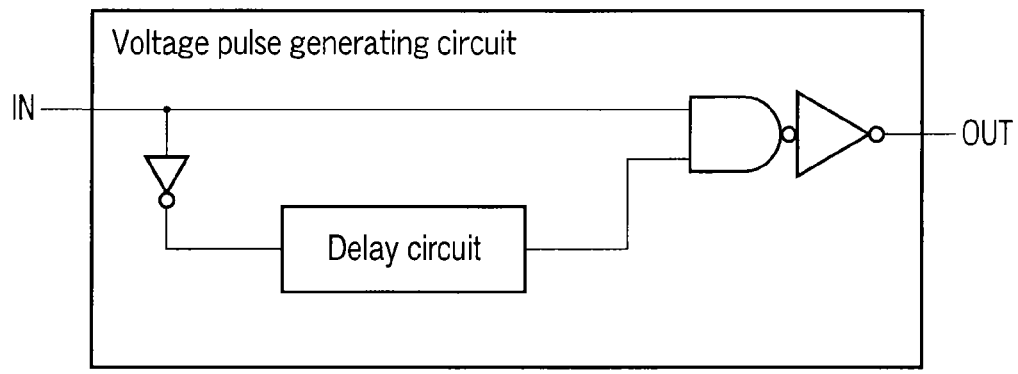
F I G. 13
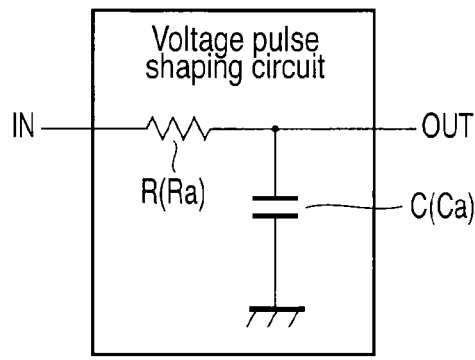
F I G. 14
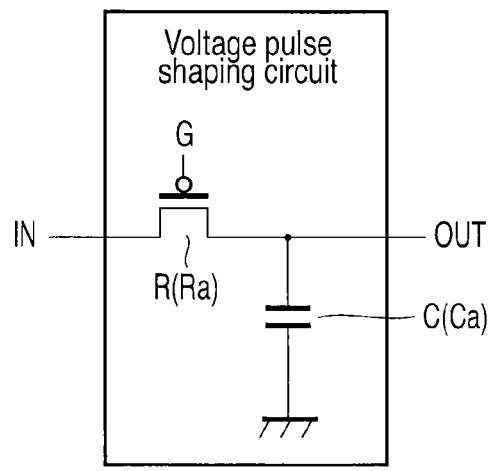
F I G. 15

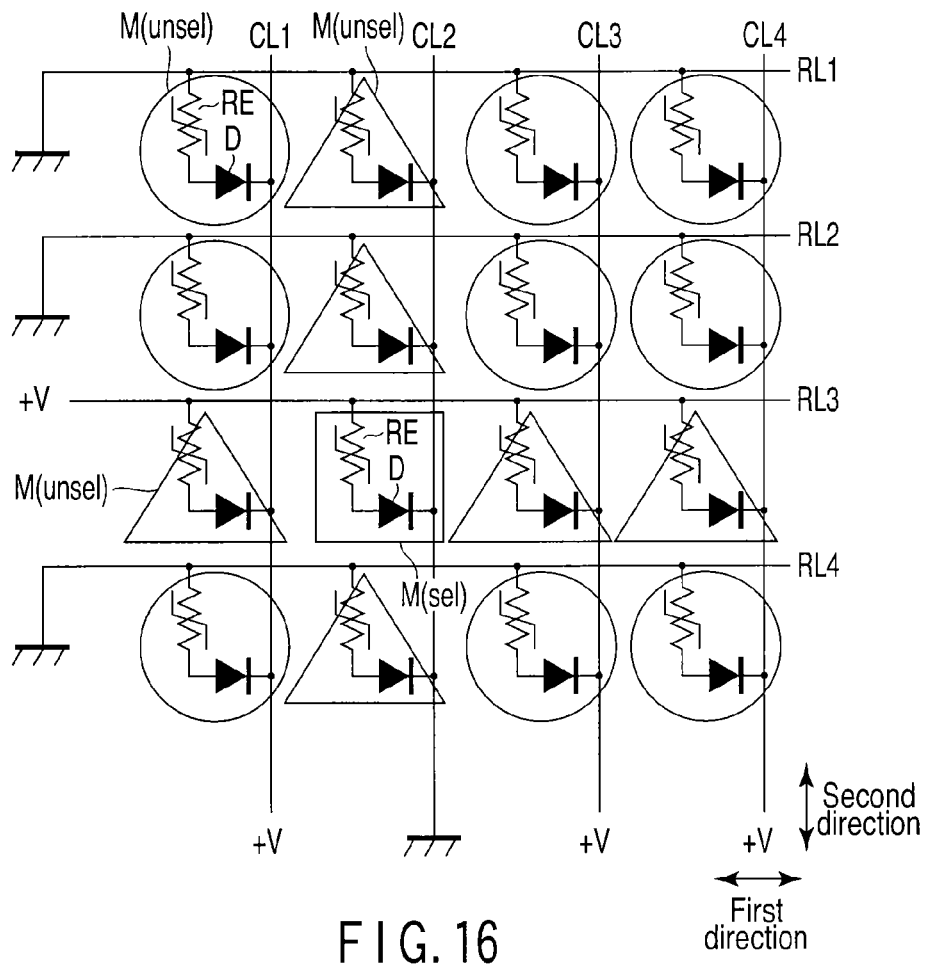
F I G. 16
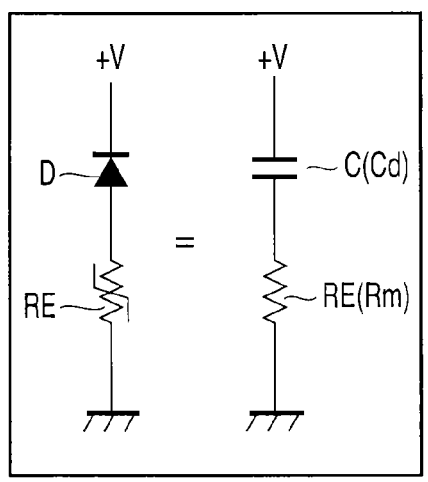
F I G. 17

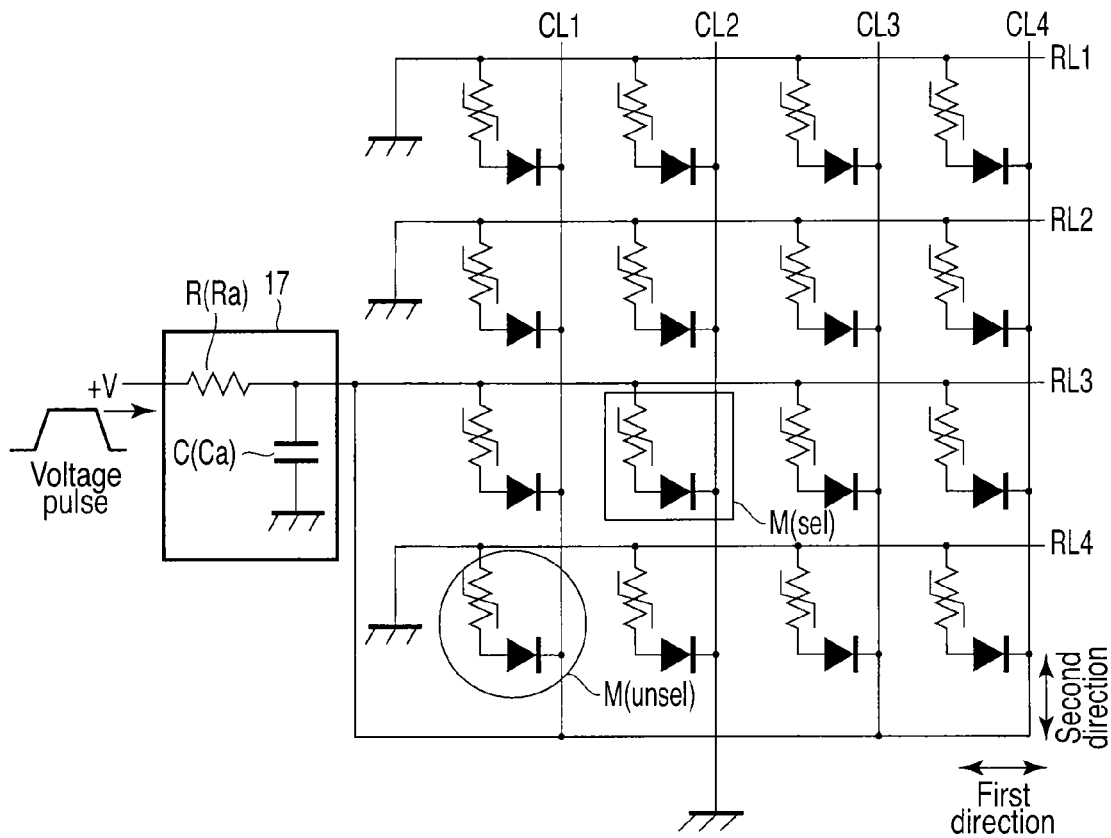
F I G. 18
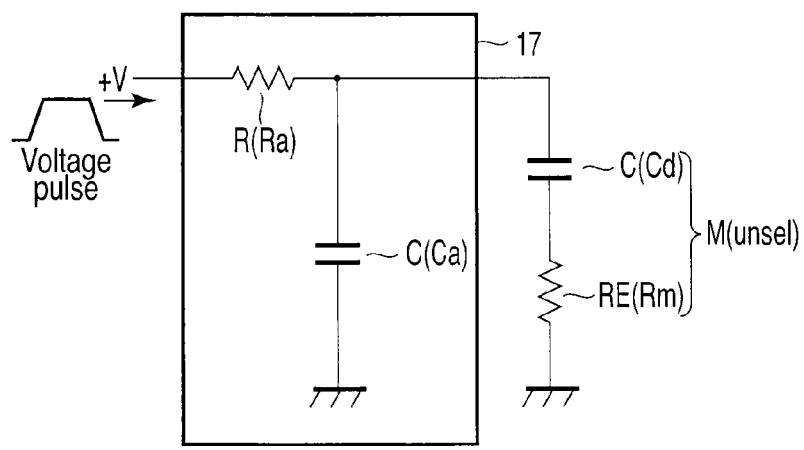
F I G. 19

RESISTANCE CHANGE MEMORY

CROSS REFERENCE TO RELATED APPLICATIONS

This application is continuation of and claims the benefit of priority under 35 U.S.C. §120 from U.S. Ser. No. 13/072,029 filed Mar. 25, 2011, the entire contents of which are incorporated herein by reference. U.S. Ser. No. 13/072,029 is a continuation application of PCT Application No. PCT/JP2008/068395 filed Oct. 9, 2008, which was published under PCT Article 21(2) in Japanese.

FIELD

Embodiments described herein relate generally to a resistance change memory using a resistance change element.

BACKGROUND

With the recent increase in the densities of the semiconductor devices, the sizes of circuit patterns of LSIs constituting the semiconductor devices are further reduced. In order to reduce the sizes of the patterns, it is necessary to not only reduce line widths but also improve the dimensional and positional accuracies of the patterns.

A storage device called a memory is not the exception. It is desired to maintain a specified number of charges required for storage in a smaller area in a cell formed using an accurate patterning technique.

Various semiconductor memories such as DRAMs, SRAMs, and flash memories have hitherto been manufactured. However, all of these memories employ MOSFETs as memory cells, so that the reduction in the size of the pattern is accompanied by a demand for an increase in the dimensional accuracy by a rate larger than that by which the size of the pattern is reduced.

Thus, a heavy burden has also been imposed on a lithography technique for forming these patterns. This in turn has increased the cost of a lithography process accounting for the major part of the present mass production cost, that is, the product cost.

On the other hand, in order to solve these problems, a memory called ReRAM (Resistive Random Access Memory) has been recently suggested. In the ReRAM, a memory cell is constituted by a nonohmic element such as a diode and a resistance change element.

The ReRAM can be achieved without using accumulated charges for storing information and without using MOSFETs for memory cells. Therefore, the ReRAM is expected to achieve a higher density than the density of the past trend.

By the way, in a diode used for a memory cell of the ReRAM, a tolerable value of a current flowing in a forward direction and a tolerable value of a leak current flowing in a backward direction need to respectively satisfy a certain standard based on the a property of a resistance change element. However, when the density increases, and the sizes of the memory cells are reduced, it is necessary to solve many technical problems in order to satisfy the certain standard.

For example, when a cell size (a size where a planar shape is assumed to be a square) is several dozen nanometers by several dozen nanometers, a large current of 1 µA or more is needed in a reset operation in which the memory cell changes from a low resistance state to a high resistance state.

A carrier scattering increases at the same time, which increases the loss, when the tolerable value of the current flowing in the forward direction is increased by increasing an atom density of an n-type impurity in an n-type semiconductor area (cathode) of a diode in order to satisfy the standard.

Accordingly, the inventor of the present application has further developed a ReRAM, and used a practical-level memory array to verify a pulse-driven high-speed writing operation, which is important in practical use. As a result, the inventor has found that, when the writing operation is executed, a so-called write error occurs at a high ratio, i.e., data are erroneously written to an unselected memory cell, to which data should not be written.

BRIEF DESCRIPTION OF THE DRAWINGS

FIGS. 1 and 2 show a first embodiment.
FIGS. 3 and 4 show a second embodiment.
FIGS. 5 and 6 show a third embodiment.
FIGS. 7 and 8 show a fourth embodiment.
FIGS. 9 and 10 show a fifth embodiment.
FIGS. 11 and 12 show a sixth embodiment.
FIG. 13 shows a voltage pulse generating circuit.
FIGS. 14 and 15 show a voltage pulse shaping circuit.
FIGS. 16 and 17 are diagrams describing a mechanism of write error.
FIGS. 18 to 21 show an equivalent circuit in data writing.

DETAILED DESCRIPTION

Figure 2:
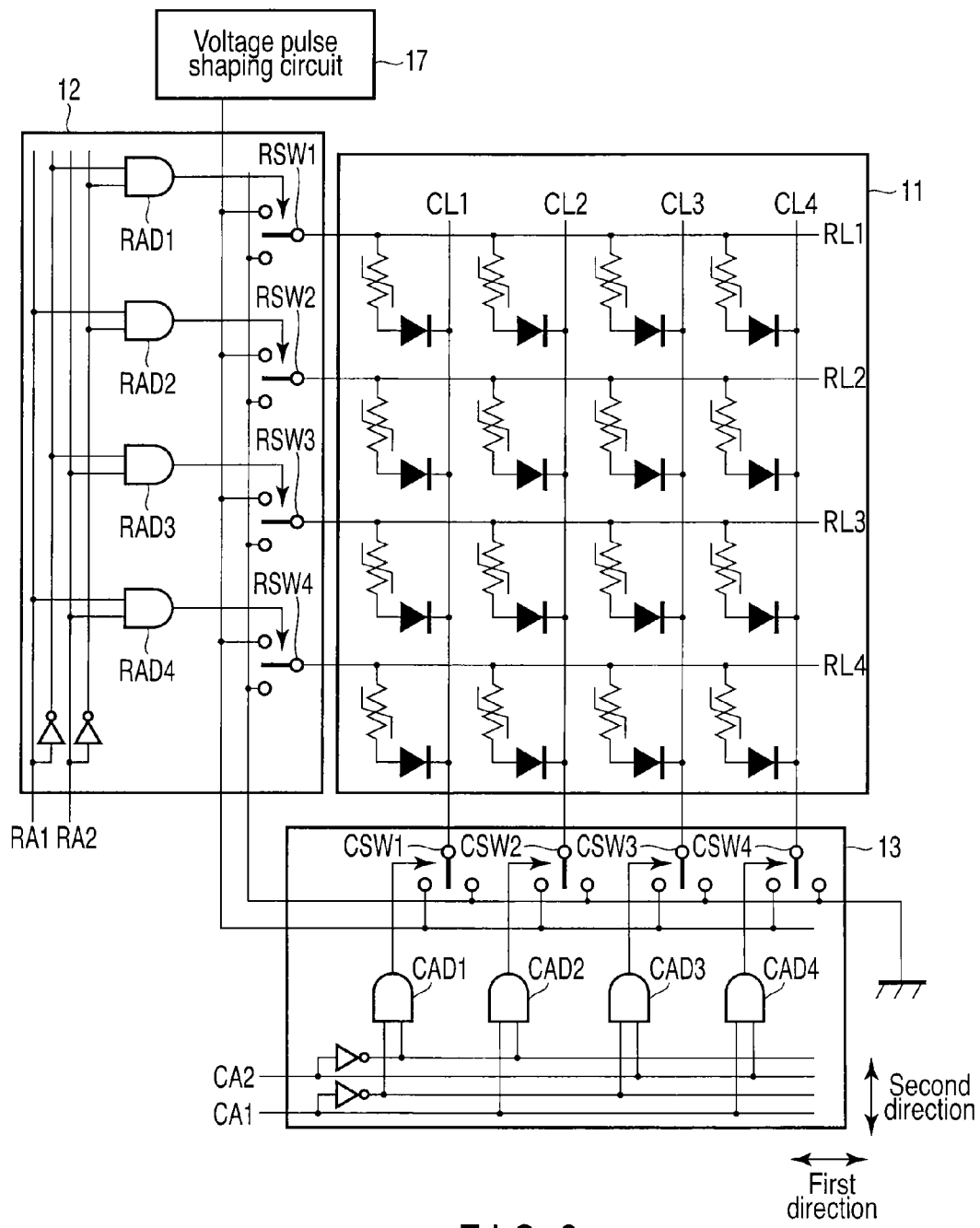

In general, according to one embodiment, a resistance change memory comprising: row lines extending in a first direction; column lines extending in a second direction cross to the first direction; memory cells each comprising a resistance change element and a diode connected in series, and each memory cell provided between one of the row lines and one of the column lines; a first decoder which selects one of the row lines as a selected row line; a second decoder which selects one of the column lines as a selected column line; a voltage pulse generating circuit which generates a voltage pulse; a voltage pulse shaping circuit which makes a rise time and a fall time of the voltage pulse longer; and a control circuit which applies the voltage pulse outputting from the voltage pulse shaping circuit to unselected column lines except the selected column line, and which applies a fixed potential to unselected row lines except the selected row line, in a data writing to a memory cell which is provided between the selected row line and the selected column line.

1. Outline

Embodiments described herein relate to a so-called cross-point type resistance change memory in which a memory cell is provided between a row line and a column line. In this kind of resistance change memory, a diode, i.e., a nonohmic element, is generally connected in series with the resistance change element in order to prevent problems such as disturb and sensitivity reduction caused by a sneak current occurring during reading and writing operations.

However, even with this kind of measure, there exists a mode in which a write error occurs in an unselected memory cell when pulse-driven high-speed writing operation is executed at a practical level.

Although the mechanism of this write error will be explained later in detail, the conclusion thereof is briefly explained here. When a voltage pulse is applied to a selected row line and unselected column lines, and a fixed voltage (for example, ground voltage) is applied to unselected row lines and a selected column line, each diode between one of the unselected row lines and one of the unselected column lines is in a reverse bias state which is equivalent to a capacitor.

Therefore, a voltage pulse having a short effective rise time and a short effective fall time is output from a voltage pulse generating circuit to the unselected column lines, an extremely high voltage is applied to resistance change elements of unselected memory cells respectively connected to the unselected column lines. This is the cause of the write error.

In view of the mechanism of the write error, the inventor suggests a technique for a cross-point type resistance change memory in which a voltage pulse shaping circuit is arranged to increase the effective rise time and the effective fall time of the voltage pulse output from the voltage pulse generating circuit during the writing operation, and further, the voltage pulse whose waveform is shaped by the voltage pulse shaping circuit is applied to the unselected column lines.

In this way, at least a rise waveform and a fall waveform of the voltage pulse applied to the unselected column lines are smoothed, and this completely eliminates the write error in the unselected memory cells during the writing operation, thus improving the reliability.

Now, in this specification, the row line and the column line are defined as follows.

The row line is a conductive line connected to an anode of a diode constituting a memory cell. The column line is a conductive line connected to a cathode of a diode constituting a memory cell.

Further, the effective rise time and the effective fall time of the voltage pulse are defined as follows.

The effective rise time is a time from when the voltage value of the voltage pulse attains a value obtained by adding 10% of the voltage difference between a minimum value and a maximum value to the minimum value and to when the voltage value of the voltage pulse attains a value obtained by subtracting 10% of the voltage difference between the minimum value and the maximum value from the maximum value.

The effective fall time is a time from when the voltage value of the voltage pulse attains a value obtained by subtracting 10% of the voltage difference between the maximum value and the maximum value from the maximum value and to when the voltage value of the voltage pulse attains a value obtained by adding 10% of the voltage difference between the minimum value and the maximum value to the minimum value.

Further, the data writing time is defined as follows.

The data writing time means at least one of a writing period in which the data writing operation is actually carried out with a predetermined bias relationship, a preparation period before the writing period, and a finish time after the writing period.

For example, in the writing period, the bias relationship is as follows. A selected row line and unselected column lines attain a high voltage (maximum value). Unselected row lines and a selected column line attain a low voltage (fixed voltage).

In this case, a reverse bias is applied to each diode between each of the unselected row lines and each of the unselected column lines.

On the other hand, in the preparation period, a rising of the voltage pulse is executed for the selected row line and the unselected column lines.

There are three types of timings for the rising of the voltage, as follows.

A-1. A rising of the voltage pulse is executed for the selected row line and the unselected column lines in parallel.

A-2. A rising of the voltage pulse is executed for all the column lines, and thereafter, a rising of the voltage pulse is executed for the selected row line. Thereafter, a falling of the voltage pulse is executed for the selected column line.

A-3. A rising of the voltage pulse is executed for the unselected column lines, and thereafter, a rising of the voltage pulse is executed for the selected row line.

In the above A-2. and the above A-3., there occurs a mode in which a reverse bias is temporarily applied to the diode between the row line and the column line.

In the finish time, a falling of the voltage pulse is executed for the selected row line and the unselected column lines. There are three types of timings for the falling of the voltage pulse, as follows.

B-1. A falling of the voltage pulse is executed for the selected row line and the unselected column lines in parallel.

B-2. A falling of the voltage pulse is executed for the selected row line, and thereafter, a falling of the voltage pulse is executed for the unselected column lines.

B-3. A rising of the voltage pulse is executed for the selected column line, and thereafter, a falling of the voltage pulse is executed for the selected row line. Thereafter, a falling of the voltage pulse is executed for all the column lines.

In the above B-2. and the above B-3., there occurs a mode in which a reverse bias is temporarily applied to the diode between the row line and the column line.

It should be noted that the waveform of the voltage pulse applied to the selected row line and the waveform of the voltage pulse applied to the unselected column lines may be the same, or may be different from each other.

2. Mechanism of a Write Error

First, the mechanism of a write error, which the embodiments relate to, will be explained.

FIG. 16 illustrates a memory cell array of a cross-point type resistance change memory.

The memory cell includes resistance change element RE and diode D connected in series between a row line and a column line. Each of the row lines extends in a first direction, and is connected to resistance change element RE arranged at the anode of diode D. Each of the column lines extends in a second direction crossing the first direction, and is connected to the cathode of diode D.

Resistance change element RE is an element changing between at least two resistance values, e.g., a low resistance state and a high resistance state, and is made of one material selected from the group consisting of $ZnMn_2O_4$, NiO, $TiO_2$, $SrZrO_3$, $Pr_{0.7}Ca_{0.3}MnO_3$.

This resistance change element RE has the following property. When a voltage equal to or higher than a certain value is applied to resistance change element RE, resistance change element RE changes from the high resistance state to the low resistance state (set). When a current equal to or higher than a certain value flows through resistance change element RE, resistance change element RE changes from the low resistance state to the high resistance state (reset).

Now, execution of writing to memory cell M (sel) between row line RL3 and column line CL2 will be considered. Writing means that resistance change element RE is changed from the high resistance state to the low resistance state, i.e., set operation.

All the remaining memory cells except for selected memory cell M (sel) are unselected memory cells M (unsel).

A voltage pulse +V is applied to a selected row line RL3 and unselected column lines CL1, CL3, CL4. A fixed voltage (for example, ground voltage) is applied to unselected row lines RL1, RL2, RL4 and a selected column line CL2.

In this case, in selected memory cell M (sel), diode D is in a forward bias state. In selected memory cell M (sel), a voltage equal to or more than a certain value is applied to resistance change element RE, and a sufficiently large current flows therethrough. Therefore, resistance change element RE changes from the high resistance state to the low resistance state.

In each of unselected memory cells M (unsel) between selected row line RL3 and one of unselected column lines CL1, CL3, CL4, the voltage pulse +V is applied to row line RL3 and column lines CL1, CL3, CL4. Therefore, no voltage is applied to resistance change element RE, and the state of resistance change element RE does not change.

Likewise, in each of unselected memory cells M (unsel) between one of unselected row lines RL1, RL2, RL4 and selected column line CL2, the fixed voltage is applied to row lines RL1, RL2, RL4 and column line CL2. Therefore, the state of resistance change element RE does not change.

Further, in each unselected memory cells M (unsel) between one of unselected row lines RL1, RL2, RL4 and one of unselected column lines CL1, CL3, CL4, the fixed voltage is applied to unselected row lines RL1, RL2, RL4, and the voltage pulse +V is applied to unselected column lines CL1, CL3, CL4. However, since diode D is in the reverse bias state, diode D becomes equivalent to a capacitor, and most of the voltage generated between one of unselected row lines RL1, RL2, RL4 and one of unselected column lines CL1, CL3, CL4 is applied to diode D. Therefore, a voltage less than a certain value is applied to resistance change element RE, and the state of resistance change element RE does not change.

Regarding the relationship between voltage value (maximum value) +V of the voltage pulse and the voltage value of the fixed voltage, the both values are not particularly limited as long as the voltage pulse +V is higher than the fixed voltage. Usually, the voltage pulse +V is set at a positive voltage. At this occasion, the fixed voltage is preferably set at the ground voltage (0 V).

Let a voltage needed for writing (set operation) be Vset, a voltage needed for erasing (reset operation) be Vreset, and a voltage needed for reading be Vread. Then, the relationship between these voltages is represented as Vread<Vreset<Vset.

The cross-point type resistance change memory is based on the above principle, and ideally, executes reading/writing/erasing operations of only selected memory cell M (sel) while preventing interference between the cells.

However, when the inventor tried to perform a practical-speed pulse-driven writing operation (set operation) to the resistance change memory having the array structure as shown in FIG. 16, the inventor found a write error occurring at a high rate, in which unselected memory cell M (unsel) changes from the high resistance state to the low resistance state.

Further, as a result of detailed analysis performed by the inventor, the inventor has found that there exists a write error mechanism as explained below.

As shown in FIG. 16, during the writing operation, diode D of each unselected memory cell M (unsel) between one of unselected row lines RL1, RL2, RL4 and one of unselected column lines CL1, CL3, CL4 is in the reverse bias state.

Since the diode in the reverse bias state is electrically equivalent to a capacitor having junction capacitance Cd, an equivalent circuit of each unselected memory cell M (unsel) between one of unselected row lines RL1, RL2, RL4 and one of unselected column lines CL1, CL3, CL4 is a series circuit including capacitor C having junction capacitance Cd and resistance change element RE having resistance value Rm as shown in FIG. 17.

As a result of analysis performed by a device simulator, junction capacitance Cd is found to be about $1 \times 10^{-18}$ F. On the other hand, resistance value Rm-high in the high resistance state of resistance change element RE is measured to be about 5 GΩ.

Figure 23:
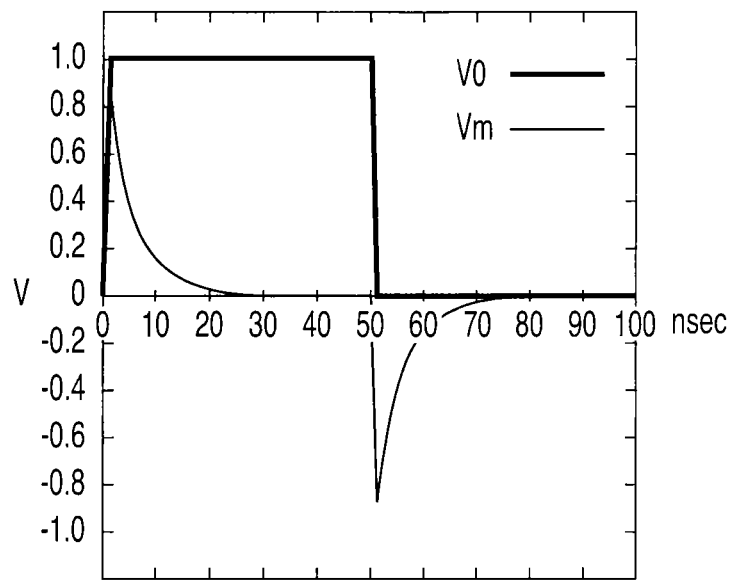
FIGS. 23 and 24 show a voltage applied to a resistance change element.

For example, as shown in FIG. 23, when a sharp voltage pulse having an effective rise time and an effective fall time of 1 nsec or less is applied to unselected column lines CL1, CL3, CL4 under these circumstances, a voltage V0 is applied between one of unselected row lines RL1, RL2, RL4 and one of unselected column lines CL1, CL3, CL4, whereas a voltage Vm is applied to resistance change element RE.

As is evident from FIG. 23, the maximum value of voltage Vm reaches about 90% of the voltage V0.

When the writing operation is assumed at this occasion, voltage Vset needed for writing (set operation) is equal to or more than a value (V0set+Vdon) obtained by adding a diode ON-voltage Vdon to a voltage V0set at which resistance change element RE changes from the high resistance state to the low resistance state and a value.

When variation of the voltage is taken into consideration, voltage Vset needed for the writing operation is preferably V0set+Vdon+α, which additionally includes voltage "+α", i.e., about 10% of voltage Vset, so as to avoid problems occurring in the circuit operation.

This Vset is the voltage V0 applied between one of unselected row lines RL1, RL2, RL4 and one of unselected column lines CL1, CL3, CL4.

However, 90% of V0, i.e., 90% of (V0set+Vdon+α), is equal to or more than V0set. This means that voltage Vm applied to resistance change element RE of FIG. 17 is equal to or more than V0set.

Therefore, in each unselected memory cell between one of unselected row lines RL1, RL2, RL4 and one of unselected column lines CL1, CL3, CL4, there occurs a write error, in which resistance change element RE changes from the high resistance state to the low resistance state.

The above is the mechanism of a write error occurrence.

In this case, it is difficult to reduce value Vset. Therefore, in order to prevent this write error, it is effective to increase the effective rise time and the effective fall time of the voltage pulse so as to prevent a high voltage from being temporarily applied to resistance change element RE.

Figure 24:
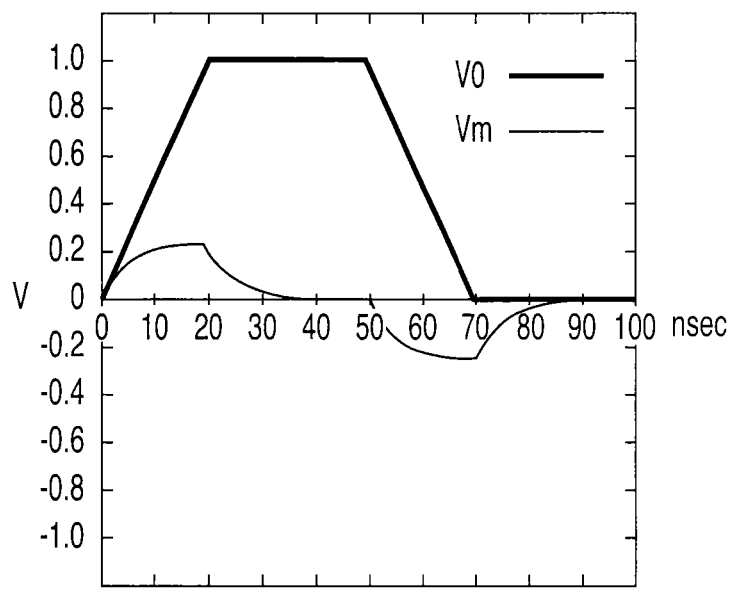

For example, as shown in FIG. 24, when a gentle voltage pulse having an effective rise time and an effective fall time of several nanoseconds to several dozen nanoseconds (for example, about 20 nsec) is applied to unselected column lines CL1, CL3, CL4, the voltage V0 is applied between one of unselected row lines RL1, RL2, RL4 and one of unselected column lines CL1, CL3, CL4, whereas voltage Vm, i.e., about 25% of the voltage V0, is applied to resistance change element RE.

The voltage Vm is about 25% of the voltage V0. Therefore, even when the voltage V0 is set at (V0set+Vdon+α), the write error mode explained above does not occur.

3. Embodiments (1) First Embodiment

A. Entire Figure

FIG. 1 illustrates a resistance change memory according to the first embodiment.

First decoder 12 is arranged at one end in a first direction of memory cell array 11. Second decoder 13 is arranged at one end in a second direction crossing the first direction of memory cell array 11. Row lines RL1 to RLn (n is a natural number equal to or more than 2) extend in the first direction from first decoder 12. Column lines CL1 to CLm (m is a natural number equal to or more than 2) extend in the second direction from second decoder 13.

An address signal is input to address buffer 14 during reading/writing/erasing operations. A portion of the address signal is input to first decoder 12 from address buffer 14. Another portion of the address signal is input to second decoder 13 from address buffer 14.

First decoder 12 selects one of row lines RL1 to RLn based on the address signal. Second decoder 13 selects one of column lines CL1 to CLm based on the address signal.

During writing operation (set), control circuit 15 outputs control signal CNT which permits generation of a voltage pulse.

When voltage pulse generating circuit 16 receives control signal CNT, voltage pulse generating circuit 16 generates a voltage pulse having a predetermined size (voltage value) and a predetermined width (duration).

For example, voltage pulse generating circuit 16 is constituted by a logical circuit as shown in FIG. 13. In FIG. 13, input signal IN corresponds to control signal CNT. When input signal IN changes from "L (low)" to "H (high)", the voltage pulse having the predetermined size and the predetermined width is output as output signal OUT.

The voltage pulse generated by voltage pulse generating circuit 16 is input to voltage pulse shaping circuit 17.

Voltage pulse shaping circuit 17 shapes the waveform of the voltage pulse. More specifically, voltage pulse shaping circuit 17 increases the effective rise time and the effective fall time of the voltage pulse output from voltage pulse generating circuit 16.

For example, voltage pulse shaping circuit 17 is constituted by a CR circuit (time constant circuit) as shown in FIGS. 14 and 15 for the purpose of increasing the effective rise time and the effective fall time of the voltage pulse. C (capacitance) is capacitor. R (resistor) is a resister element or a current limiting element such as a MOS transistor (ON resistance).

The voltage pulse whose waveform is shaped by voltage pulse shaping circuit 17 is provided to a selected row line of row lines RL1 to RLn via first decoder 12. The voltage pulse whose waveform is shaped by voltage pulse shaping circuit 17 is provided to unselected column lines of column lines CL1 to CLm via second decoder 13.

At this occasion, the unselected row lines and the selected column line are set at a fixed voltage such as a ground voltage.

B. Partial Figure

FIG. 2 illustrates an exemplary circuit including a memory cell array, a first decoder, and a second decoder in the resistance change memory of FIG. 1.

In this example, four row lines and four column lines are shown for the sake of simplifying the explanation.

In memory cell array 11, four row lines RL1, RL2, RL3, RL4 extend in the first direction, and four column lines CL1, CL2, CL3, CL4 extend in the second direction. Each memory cell is provided between one of row lines RL1, RL2, RL3, RL4 and one of column lines CL1, CL2, CL3, CL4.

The memory cell includes the resistance change element and the diode, which are connected in series.

In memory cell array 11 as described above, row lines RL1, RL2, RL3, RL4 and column lines CL1, CL2, CL3, CL4 are simply made of a line-and-space pattern. Accordingly, it is not necessary to consider displacement of these upper and lower conductive lines.

Therefore, the accuracy of positioning within memory cell array 11 may be reduced to an extremely low level, which enables easy manufacturing of memory cell array 11.

First decoder 12 is constituted by switch circuits RSW1, RSW2, RSW3, RSW4 and AND circuits RAD1, RAD2, RAD3, RAD4.

For example, switch circuits RSW1, RSW2, RSW3, RSW4 and AND circuits RAD1, RAD2, RAD3, RAD4 are CMOS circuits.

When both of address signals RA1, RA2 are at the "L" level, the output signal of AND circuit RAD1 attains the "H" level, and switch circuit RSW1 electrically connects row line RL1 to pulse shaping circuit 17. At this occasion, the output signals of AND circuits RAD2, RAD3, RAD4 are at the "L" level, and switch circuits RSW2, RSW3, RSW4 fix row lines RL2, RL3, RL4 at a fixed voltage (in this case, ground voltage).

When address signal RA1 is at the "H" level, and address signal RA2 is at the "L" level, the output signal of AND circuit RAD2 attains the "H" level, and switch circuit RSW2 electrically connects row line RL2 to pulse shaping circuit 17. At this occasion, the output signals of AND circuits RAD1, RAD3, RAD4 are at the "L" level, and switch circuits RSW1, RSW3, RSW4 fix row lines RL1, RL3, RL4 at the fixed voltage.

When address signal RA1 is at the "L" level, and address signal RA2 is at the "H" level, the output signal of AND circuit RAD3 attains the "H" level, and switch circuit RSW3 electrically connects row line RL3 to pulse shaping circuit 17. At this occasion, the output signals of AND circuits RAD1, RAD2, RAD4 are at the "L" level, and switch circuits RSW1, RSW2, RSW4 fix row lines RL1, RL2, RL4 at the fixed voltage.

When both of address signals RA1, RA2 are at the "H" level, the output signal of AND circuit RAD4 attains the "H" level, and switch circuit RSW4 electrically connects row line RL4 to pulse shaping circuit 17. At this occasion, the output signals of AND circuits RAD1, RAD2, RAD3 are at the "L" level, and switch circuits RSW1, RSW2, RSW3 fix row lines RL1, RL2, RL3 at the fixed voltage.

Second decoder 13 includes switch circuits CSW1, CSW2, CSW3, CSW4 and AND circuits CAD1, CAD2, CAD3, CAD4.

For example, switch circuits CSW1, CSW2, CSW3, CSW4 and AND circuits CAD1, CAD2, CAD3, CAD4 are CMOS circuits.

When both of address signals CA1, CA2 are at the "L" level, the output signal of AND circuit CAD1 attains the "H" level, and switch circuit CSW1 fixes column line CL1 at the fixed voltage (in this case, ground voltage). At this occasion, the output signals of AND circuits CAD2, CAD3, CAD4 are at the "L" level, and switch circuits CSW2, CSW3, CSW4 electrically connect column lines CL2, CL3, CL4 to pulse shaping circuit 17.

When address signal CA1 is at the "H" level, and address signal CA2 is at the "L" level, the output signal of AND circuit CAD2 attains the "H" level, and switch circuit CSW2 fixes column line CL2 at the fixed voltage. At this occasion, the output signals of AND circuits CAD1, CAD3, CAD4 are at the "L" level, and switch circuits CSW1, CSW3, CSW4 electrically connect column lines CL1, CL3, CL4 to pulse shaping circuit 17.

When address signal CA1 is at the "L" level, and address signal CA2 is at the "H" level, the output signal of AND circuit CAD3 attains the "H" level, and switch circuit CSW3 fixes column line CL3 at the fixed voltage. At this occasion, the output signals of AND circuits CAD1, CAD2, CAD4 are at the "L" level, and switch circuits CSW1, CSW2, CSW4 electrically connect column lines CL1, CL2, CL4 to pulse shaping circuit 17.

When both of address signals CA1, CA2 are at the "H" level, the output signal of AND circuit CAD4 attains the "H" level, and switch circuit CSW4 fixes column line CL4 at the fixed voltage. At this occasion, the output signals of AND circuits CAD1, CAD2, CAD3 are at the "L" level, and switch circuits CSW1, CSW2, CSW3 electrically connect column lines CL1, CL2, CL3 to pulse shaping circuit 17.

C. Effects

The effects of the first embodiment will be explained.

FIG. 18 illustrates an equivalent circuit of a memory cell array during writing operation.

RL1, RL2, RL3, RL4 denote the row lines. CL1, CL2, CL3, CL4 denote the column lines.

The voltage pulse output from voltage pulse shaping circuit 17 is applied to selected row line RL3 and unselected column lines CL1, CL3, CL4. Unselected row lines RL1, RL2, RL4 and selected column line CL2 are set at the fixed voltage such as a ground voltage.

In selected memory cell M (sel), a forward bias is applied to the diode, and a large voltage is applied to the resistance change element. Thus, writing is performed.

In this state, as shown in FIG. 19, a reverse bias is applied to the diode in unselected memory cell M (unsel). Therefore, the diode is equivalent to capacitor C having junction capacitance Cd.

In this case, it is assumed that, in voltage pulse shaping circuit 17 as shown in FIGS. 18 and 19, current limiting element R has resistance value Ra, and capacitor C has capacitance Ca. In unselected memory cell M (unsel), resistance change element RE has resistance value Rm, and the capacitor (diode) C has junction capacitance Cd.

It is assumed that the voltage pulse output from the voltage pulse shaping circuit has a rise time or a fall time of T1, and has a maximum voltage value of Vf.

At this occasion, voltage Vm applied to both ends of resistance change element RE (resistance value Rm) at time t is obtained by solving a differential equation of the current and the voltage as follows.

Where t<T1, voltage Vm is obtained from the following equation.

[Equation 1]

$$Vm(t) = \left(1 - \exp\left(-\frac{t}{C_d R_m}\right)\right) \frac{C_d R_m}{T_1} V_f \quad (1)$$

Where t>T1, voltage Vm is obtained from the following equation.

[Equation 2]

$$Vm(t) = \left(\exp\left(\frac{T_1}{C_d R_m}\right) - 1\right) \exp\left(-\frac{t}{C_d R_m}\right) \frac{C_d R_m}{T_1} V_f \quad (2)$$

The maximum value of voltage Vm applied to resistance change element Rm can be reduced to 25% or less of the maximum value of the voltage V0 as shown in FIG. 24 by configuring the values as follows: T1 is set at 20 nsec, junction capacitance Cd of the diode is set at $1 \times 10^{-18}$ F, and the resistance value (resistance value of high resistance state) Rm of the resistance change element is set at 5 GΩ.

As a result, even when the voltage V0 is set at Vset (=V0set +Vdon+α), the maximum value of voltage Vm does not attain a value more than V0set, which prevents a write error in which the resistance change element in an unselected memory cell changes from the high resistance state to the low resistance state.

As can be understood from Equation (1) and Equation (2), maximum value Vmax of voltage Vm applied to the resistance change element is obtained from the following equation.

[Equation 3]

$$V_{max} = \left(1 - \exp\left(-\frac{T_1}{C_d R_m}\right)\right) \frac{C_d R_m}{T_1} V_f \quad (3)$$

Therefore, the effects of the embodiment can be obtained by setting rise time/fall time T1 so that maximum value Vmax given by Equation (3) does not exceed V0set.

As is evident from Equation (3), an essential parameter for determining maximum value Vmax is a ratio between rise time T1 of the pulse and the product of resistance value Rm of the resistance change element and junction capacitance Cd of the diode. Where this ratio is defined as x, Equation (3) can be transformed into Vmax/Vf=(1−exp (−x))/x.

The right side is a monotonically decreasing function that yields 1 where x=0. Where x>1, the function yields a value less than 0.63, which has an effect of reducing maximum value Vmax.

In other words, when rise time/fall time T1 of the voltage pulse is set at a value more than the product of the junction capacitance of the diode and the resistance value in the high resistance state, i.e., the maximum value of the resistance value of the resistance change element, the above ratio x is more than 1. Therefore, the effects of the embodiment can be achieved.

Now, a waveform is considered, in which the minimum value and the maximum value of the voltage pulse is constant (straight line), and the waveform changes linearly from the minimum value to the maximum value. The relationship between rise time/fall time T1 for the change from the minimum value to the maximum value and an effective rise time/ effective fall time Ti according to the definition of the embodiment is represented as Ti=0.8×T1.

For example, values Ca and Ra are as follows so that effective rise time T1 does not allow maximum value Vmax given by Equation (3) to attain a value more than V0set.

Where T1 is 20 nsec, CaRa is 7.28 nsec.

Accordingly, where Ca is 1 pF, Ra is set at a value equal to or more than 7.28 kΩ. Where T1 is 10 nsec, CaRa is 3.64 nsec. Accordingly, where Ca is 1 pF, Ra is set at a value equal to or more than 3.64 kΩ.

This can be derived as follows. The relationship of the effective rise time Ti=(ln 9)×(CaRa) can be obtained from Equation (1), and the relationship of Ti=0.8×T1 holds. Therefore, the relational expression, CaRa=0.8/(ln 9)×T1, holds.

D. Others

In the first embodiment, when a resistor element is used as the current limiting element in the voltage pulse shaping circuit, the resistor element may be made of a diffused resistor in a semiconductor substrate, or may be made of a polysilicon resistor on a semiconductor substrate.

When a P-channel MOSFET is used as the current limiting element in the voltage pulse shaping circuit, the P-channel MOSFET functions as a constant-current element in a current saturation region. Therefore, ideal waveforms can be obtained in which the rise waveform and the fall waveform are straight.

When the P-channel MOSFET is used as the current limiting element in the voltage pulse shaping circuit, the charge stored in the capacitor can be quickly discharged via the P-channel MOSFET after the writing operation. Therefore, this configuration is advantageous when the writing operation is repeated at a high speed.

One voltage pulse shaping circuit may be arranged commonly at the side of the row lines or the side of the column lines. Alternatively, one voltage pulse shaping circuit may be arranged at the side of the row lines, and another voltage pulse shaping circuit may be arranged at the side of the column lines.

Further, the resistance value of the current limiting element and the capacitance of the capacitor in the voltage pulse shaping circuit are preferably determined in view of the parasitic resistance and the parasitic capacitance of the conductive line transmitting the voltage pulse. Alternatively, the current limiting element and the capacitor in the voltage pulse shaping circuit may be constituted by only the parasitic resistance and the parasitic capacitance of the conductive line.

(2) Second Embodiment

A second embodiment is a modification of the first embodiment.

According to the mechanism of occurrence of a write error which is addressed by the embodiments, there is a possibility that a write error occurs in an unselected memory cell in which a reverse bias is applied to the diode.

Therefore, from the view point of preventing the write error in unselected memory cells in each of which a reverse bias is applied to the diode, the object can be achieved by increasing only the effective rise time and the effective fall time of the voltage pulse applied to the unselected column lines.

Accordingly, in the second embodiment, the voltage pulse output from a voltage pulse generating circuit is given to a selected row line as in the past, but the voltage pulse output from a voltage pulse shaping circuit is given to the unselected column lines.

A. Entire Figure

FIG. 3 illustrates a resistance change memory according to the second embodiment.

Memory cell array 11, first decoder 12, second decoder 13, address buffer 14, control circuit 15, voltage pulse generating circuit 16, and voltage pulse shaping circuit 17 have the same configurations and functions as those of the first embodiment.

The second embodiment is different from the first embodiment in that a voltage pulse generated by voltage pulse generating circuit 16 is provided to a selected row line of row lines RL1 to RLn via first decoder 12.

When voltage pulse generating circuit 16 receives control signal CNT, voltage pulse generating circuit 16 generates a voltage pulse having a predetermined size (voltage value) and a predetermined width (duration). Voltage pulse shaping circuit 17 increases a rise time and a fall time of the voltage pulse output from voltage pulse generating circuit 16.

The voltage pulse generated by voltage pulse generating circuit 16 is provided to the selected row line of row lines RL1 to RLn via first decoder 12. The voltage pulse whose waveform is shaped by voltage pulse shaping circuit 17 is provided to unselected column lines of column lines CL1 to CLm via second decoder 13.

At this occasion, the unselected row lines and the selected column line are set at a fixed voltage such as a ground voltage.

B. Partial Figure

FIG. 4 illustrates an exemplary circuit including a memory cell array, a first decoder, and a second decoder in the resistance change memory of FIG. 3.

In this example, four row lines and four column lines are shown for the sake of simplifying the explanation.

In memory cell array 11, four row lines RL1, RL2, RL3, RL4 extend in a first direction, and four column lines CL1, CL2, CL3, CL4 extend in a second direction. Each memory cell is provided between one of row lines RL1, RL2, RL3, RL4 and one of column lines CL1, CL2, CL3, CL4.

The memory cell includes a resistance change element and a diode, which are connected in series.

In memory cell array 11 as described above, row lines RL1, RL2, RL3, RL4 and column lines CL1, CL2, CL3, CL4 are simply made of a line-and-space pattern. Accordingly, it is not necessary to consider displacement of these upper and lower conductive lines.

Therefore, the accuracy of positioning within memory cell array 11 may be reduced to an extremely low level, which enables easy manufacturing of memory cell array 11.

First decoder 12 is constituted by switch circuits RSW1, RSW2, RSW3, RSW4 and AND circuits RAD1, RAD2, RAD3, RAD4.

For example, switch circuits RSW1, RSW2, RSW3, RSW4 and AND circuits RAD1, RAD2, RAD3, RAD4 are CMOS circuits.

AND circuits RAD1, RAD2, RAD3, RAD4 and switch circuits RSW1, RSW2, RSW3, RSW4 operate in response to the values of address signals RA1, RA2 in the same manner as the first embodiment. Therefore, description thereof is omitted.

Second decoder 13 includes switch circuits CSW1, CSW2, CSW3, CSW4 and AND circuits CAD1, CAD2, CAD3, CAD4.

For example, switch circuits CSW1, CSW2, CSW3, CSW4 and AND circuits CAD1, CAD2, CAD3, CAD4 are CMOS circuits.

AND circuits CAD1, CAD2, CAD3, CAD4 and switch circuits CSW1, CSW2, CSW3, CSW4 operate in response to the values of address signals CA1, CA2 in the same manner as the first embodiment. Therefore, description thereof is omitted.

C. Effects

Like the first embodiment, the second embodiment prevents a write error.

In other words, rise time/fall time T1 is set so that maximum value Vmax given by Equation (3) of the first embodiment does not exceed V0set.

Rise time/fall time T1 of the voltage pulse is set at a value more than a product of a junction capacitance of the diode and a resistance value in a high resistance state, i.e., the maximum value of the resistance value of the resistance change element.

D. Others

The second embodiment may also be modified in the same manner as the first embodiment.

In the second embodiment, the effective rise time/the effective fall time of the voltage pulse applied to the selected row line is different from the effective rise time/the effective fall time of the voltage pulse applied to the unselected column lines. Therefore, during the writing operation, a sneak current may flow between one of the row lines and one of the column lines.

Because of the specification of the resistance change memory, it is preferable to employ the first embodiment when such sneak current is generated. On the other hand, when this sneak current is not generated, or when the sneak current hardly causes any problem even if it is generated, it is preferable to employ the second embodiment.

(3) Third Embodiment

Compared with the first embodiment, a third embodiment is characterized in the position of a voltage pulse shaping circuit. In the embodiment, a voltage pulse shaping circuit is arranged adjacent to memory cell array 11 so as to reduce a transmission distance of a voltage pulse whose waveform is shaped and to prevent deformation of the waveform of the voltage pulse, thus stabilizing operation of the memory.

A. Entire Figure

FIG. 5 illustrates a resistance change memory according to the third embodiment.

First decoder 22 is arranged at one end in a first direction of memory cell array 21. Second decoder 23 is arranged at one end in a second direction crossing the first direction of memory cell array 21. Row lines RL1 to RLn (n is a natural number equal to or more than 2) extend in the first direction from first decoder 22. Column lines CL1 to CLm (m is a natural number equal to or more than 2) extend in the second direction from second decoder 23.

An address signal is input to address buffer 24 during reading/writing/erasing operations. A portion of the address signal is input to first decoder 22 from address buffer 24. Another portion of the address signal is input to second decoder 23 from address buffer 24.

First decoder 22 selects one of row lines RL1 to RLn based on the address signal. Second decoder 23 selects one of column lines CL1 to CLm based on the address signal.

During the writing operation (set), control circuit 25 outputs control signal CNT which permits generation of a voltage pulse.

When voltage pulse generating circuit 26 receives control signal CNT, voltage pulse generating circuit 26 generates a voltage pulse having a predetermined size (voltage value) and a predetermined width (duration).

For example, voltage pulse generating circuit 26 is constituted by a logical circuit as shown in FIG. 13. In FIG. 13, input signal IN corresponds to control signal CNT. When input signal IN changes from "L (low)" to "H (high)", the voltage pulse having the predetermined size and the predetermined width is output as output signal OUT.

The voltage pulse generated by voltage pulse generating circuit 26 is input to voltage pulse shaping circuit 27 via first decoder 22. The voltage pulse generated by voltage pulse generating circuit 26 is input to voltage pulse shaping circuit 28 via second decoder 23.

Voltage pulse shaping circuits 27, 28 shape the waveforms of the voltage pulses. More specifically, voltage pulse shaping circuits 27, 28 increase the effective rise time and the effective fall time of the voltage pulse output from voltage pulse generating circuit 26.

For example, each of voltage pulse shaping circuits 27, 28 is constituted by a CR circuit (time constant circuit) as shown in FIGS. 14 and 15 for the purpose of increasing the effective rise time and the effective fall time of the voltage pulse. C (capacitance) is a capacitor. R (resistor) is a resister element or a current limiting element such as a MOS transistor (ON resistance).

The voltage pulse whose waveform is shaped by voltage pulse shaping circuit 27 is provided to a selected row line of row lines RL1 to RLn. The voltage pulse whose waveform is shaped by voltage pulse shaping circuit 28 is provided to unselected column lines of column lines CL1 to CLm.

At this occasion, the unselected row lines and the selected column line are set at a fixed voltage such as a ground voltage.

It should be noted that voltage pulse shaping circuit 27 is preferably configured such that the voltage pulse shaping circuit as shown in FIGS. 14 and 15 is connected to each of row lines RL1 to RLn.

In this case, the voltage pulse output from voltage pulse generating circuit 26 is given to a voltage pulse shaping circuit corresponding to a row line selected by first decoder 22, so that the voltage pulse whose waveform is shaped can be provided to the selected row line.

Likewise, voltage pulse shaping circuit 28 is preferably configured such that the voltage pulse shaping circuit as shown in FIGS. 14 and 15 is connected to each of column lines CL1 to CLm.

In this case, the voltage pulse output from voltage pulse generating circuit 26 is given to voltage pulse shaping circuits corresponding to all column lines except for the column line selected by second decoder 23, so that the voltage pulse whose waveform is shaped can be provided to the unselected column lines.

B. Partial Figure

FIG. 6 illustrates an exemplary circuit including a memory cell array, a first decoder, and a second decoder in the resistance change memory of FIG. 5.

In this example, four row lines and four column lines are shown for the sake of simplifying the explanation.

In memory cell array 21, four row lines RL1, RL2, RL3, RL4 extend in the first direction, and four column lines CL1, CL2, CL3, CL4 extend in the second direction. Each memory cell is provided between one of row lines RL1, RL2, RL3, RL4 and one of column lines CL1, CL2, CL3, CL4.

The memory cell includes a resistance change element and a diode, which are connected in series.

In memory cell array 21 as described above, row lines RL1, RL2, RL3, RL4 and column lines CL1, CL2, CL3, CL4 are simply made of a line-and-space pattern. Accordingly, it is not necessary to consider displacement of these upper and lower conductive lines.

Therefore, the accuracy of positioning within memory cell array 21 may be reduced to an extremely low level, which enables easy manufacturing of memory cell array 11.

First decoder 22 is constituted by switch circuits RSW1, RSW2, RSW3, RSW4 and AND circuits RAD1, RAD2, RAD3, RAD4.

For example, switch circuits RSW1, RSW2, RSW3, RSW4 and AND circuits RAD1, RAD2, RAD3, RAD4 are CMOS circuits.

When both of address signals RA1, RA2 are at the "L" level, the output signal of AND circuit RAD1 attains the "H" level, and switch circuit RSW1 electrically connects row line RL1 to voltage pulse generating circuit 26. At this occasion, the output signals of AND circuits RAD2, RAD3, RAD4 are at the "L" level, and switch circuits RSW2, RSW3, RSW4 fix row lines RL2, RL3, RL4 at a fixed voltage (in this case, ground voltage).

Therefore, the waveform of the voltage pulse output from voltage pulse generating circuit 26 is shaped by the voltage pulse shaping circuit connected to row line RL1, and thereafter, the shaped voltage pulse is provided to row line RL1.

When address signal RA1 is at the "H" level, and address signal RA2 is at the "L" level, the output signal of AND circuit RAD2 attains the "H" level, and switch circuit RSW2 electrically connects row line RL2 to voltage pulse generating circuit 26. At this occasion, the output signals of AND circuits RAD1, RAD3, RAD4 are at the "L" level, and switch circuits RSW1, RSW3, RSW4 fix row lines RL1, RL3, RL4 at the fixed voltage.

Therefore, the waveform of the voltage pulse output from voltage pulse generating circuit 26 is shaped by the voltage pulse shaping circuit connected to row line RL2, and thereafter, the shaped voltage pulse is provided to row line RL2.

When address signal RA1 is at the "L" level, and address signal RA2 is at the "H" level, the output signal of AND circuit RAD3 attains the "H" level, and switch circuit RSW3 electrically connects row line RL3 to voltage pulse generating circuit 26. At this occasion, the output signals of AND circuits RAD1, RAD2, RAD4 are at the "L" level, and switch circuits RSW1, RSW2, RSW4 fix row lines RL1, RL2, RL4 at the fixed voltage.

Therefore, the waveform of the voltage pulse output from voltage pulse generating circuit 26 is shaped by the voltage pulse shaping circuit connected to row line RL3, and thereafter, the shaped voltage pulse is provided to row line RL3.

When both of address signals RA1, RA2 are at the "H" level, the output signal of AND circuit RAD4 attains the "H" level, and switch circuit RSW4 electrically connects row line RL4 to pulse generating circuit 26. At this occasion, the output signals of AND circuits RAD1, RAD2, RAD3 are at the "L" level, and switch circuits RSW1, RSW2, RSW3 fix row lines RL1, RL2, RL3 at the fixed voltage.

Therefore, the waveform of the voltage pulse output from voltage pulse generating circuit 26 is shaped by the voltage pulse shaping circuit connected to row line RL4, and thereafter, the shaped voltage pulse is provided to row line RL4.

Second decoder 23 includes switch circuits CSW1, CSW2, CSW3, CSW4 and AND circuits CAD1, CAD2, CAD3, CAD4.

For example, switch circuits CSW1, CSW2, CSW3, CSW4 and AND circuits CAD1, CAD2, CAD3, CAD4 are CMOS circuits.

When both of address signals CA1, CA2 are at the "L" level, the output signal of AND circuit CAD1 attains the "H" level, and switch circuit CSW1 fixes column line CL1 at the fixed voltage (in this case, ground voltage). At this occasion, the output signals of AND circuits CAD2, CAD3, CAD4 are at the "L" level, and switch circuits CSW2, CSW3, CSW4 electrically connect column lines CL2, CL3, CL4 to voltage pulse generating circuit 26.

Therefore, the waveform of the voltage pulse output from voltage pulse generating circuit 26 is shaped by the voltage pulse shaping circuits connected to column lines CL2, CL3, CL4, and thereafter, the shaped voltage pulses are provided to column lines CL2, CL3, CL4.

When address signal CA1 is at the "H" level, and address signal CA2 is at the "L" level, the output signal of AND circuit CAD2 attains the "H" level, and switch circuit CSW2 fixes column line CL2 at the fixed voltage. At this occasion, the output signals of AND circuits CAD1, CAD3, CAD4 are at the "L" level, and switch circuits CSW1, CSW3, CSW4 electrically connect column lines CL1, CL3, CL4 to voltage pulse generating circuit 26.

Therefore, the waveform of the voltage pulse output from voltage pulse generating circuit 26 is shaped by the voltage pulse shaping circuits connected to column lines CL1, CL3, CL4, and thereafter, the shaped voltage pulses are provided to column lines CL1, CL3, CL4.

When address signal CA1 is at the "L" level, and address signal CA2 is at the "H" level, the output signal of AND circuit CAD3 attains the "H" level, and switch circuit CSW3 fixes column line CL3 at the fixed voltage. At this occasion, the output signals of AND circuits CAD1, CAD2, CAD4 are at the "L" level, and switch circuits CSW1, CSW2, CSW4 electrically connect column lines CL1, CL2, CL4 to voltage pulse generating circuit 26.

Therefore, the waveform of the voltage pulse output from voltage pulse generating circuit 26 is shaped by the voltage pulse shaping circuits connected to column lines CL1, CL2, CL4, and thereafter, the shaped voltage pulses are provided to column lines CL1, CL2, CL4.

When both of address signals CA1, CA2 are at the "H" level, the output signal of AND circuit CAD4 attains the "H" level, and switch circuit CSW4 fixes column line CL4 at the fixed voltage. At this occasion, the output signals of AND circuits CAD1, CAD2, CAD3 are at the "L" level, and switch circuits CSW1, CSW2, CSW3 electrically connect column lines CL1, CL2, CL3 to voltage pulse generating circuit 26.

Therefore, the waveform of the voltage pulse output from voltage pulse generating circuit 26 is shaped by the voltage pulse shaping circuits connected to column lines CL1, CL2, CL3 and thereafter, the shaped voltage pulses are provided to column lines CL1, CL2, CL3.

C. Effects

The effects of the third embodiment will be explained.

Figure 20:
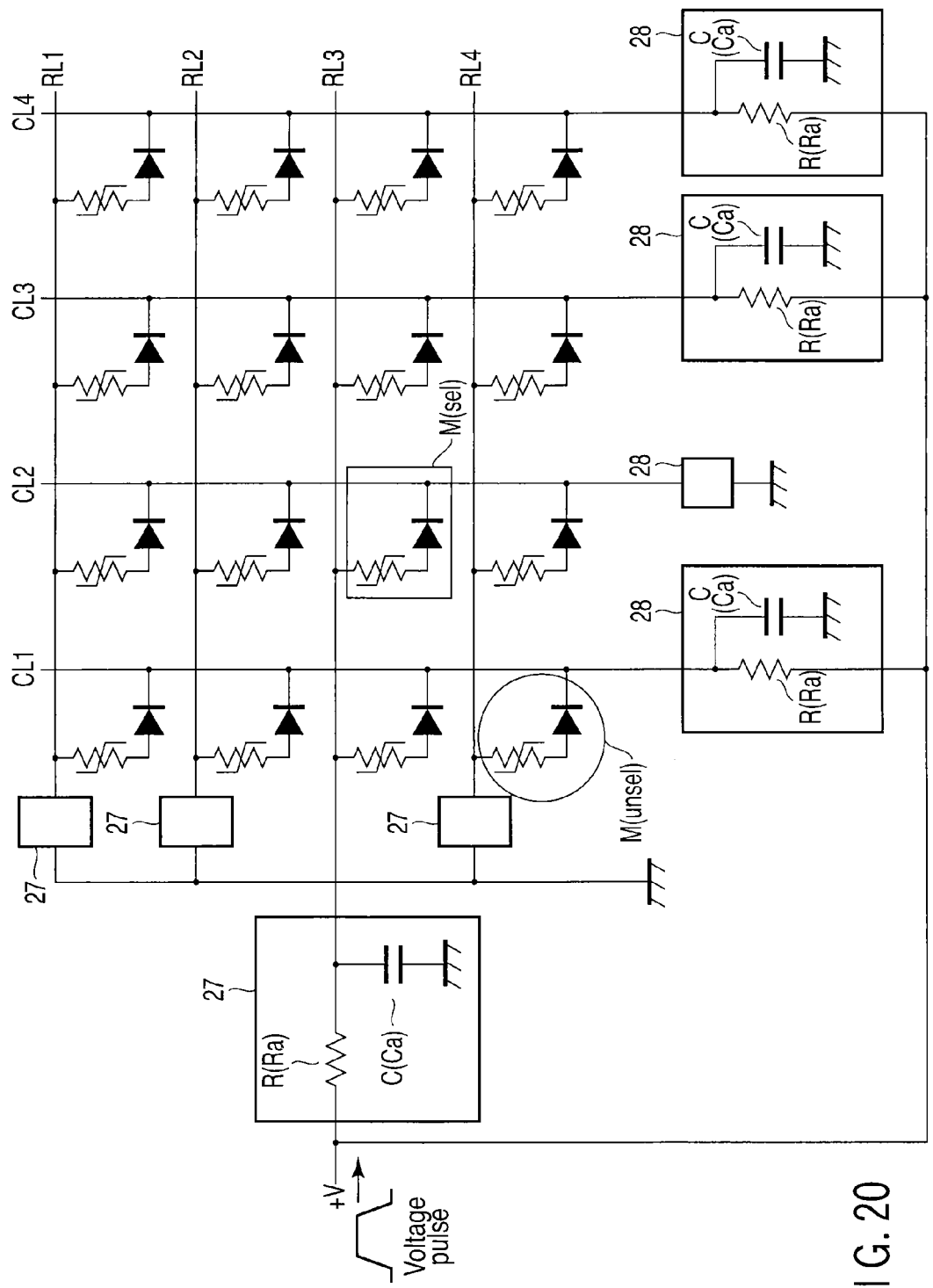

FIG. 20 illustrates an equivalent circuit of a memory cell array during the writing operation.

RL1, RL2, RL3, RL4 denote the row lines. CL1, CL2, CL3, CL4 denote the column lines.

The voltage pulse whose waveform is shaped by voltage pulse shaping circuit 27 directly connected to row line RL3 is applied to selected row line RL3. The voltage pulse whose waveform is shaped by voltage pulse shaping circuit 28 directly connected to column lines CL1, CL3, CL4 is applied to unselected column lines CL1, CL3, CL4.

Unselected row lines RL1, RL2, RL4 and selected column line CL2 are set at the fixed voltage such as the ground voltage.

In selected memory cell M (sel), a forward bias is applied to the diode, and a large voltage is applied to the resistance change element. Thus, writing is performed.

Figure 21:
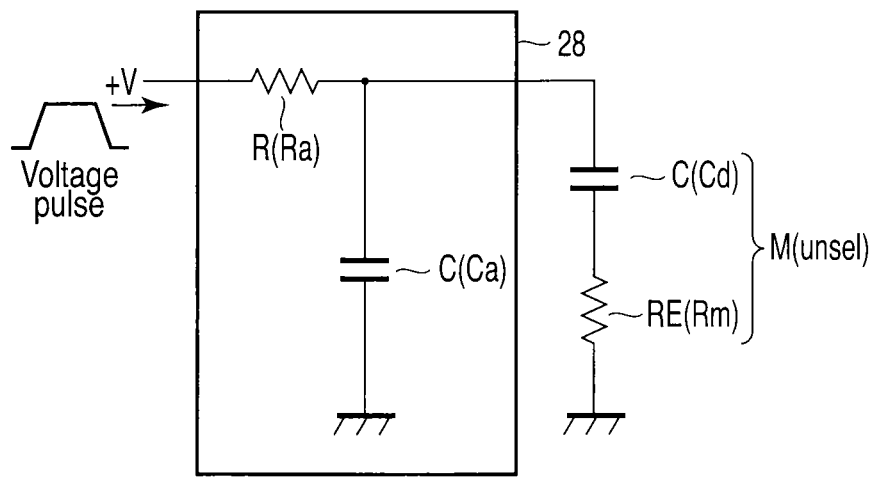

In this state, as shown in FIG. 21, a reverse bias is applied to the diode in unselected memory cell M (unsel). Therefore, the diode is equivalent to capacitor C having junction capacitance Cd.

In this case, it is assumed that, in voltage pulse shaping circuit 28 as shown in FIGS. 20 and 21, current limiting element R has resistance value Ra, and capacitor C has capacitance Ca. In unselected memory cell M (unsel), resistance change element RE has resistance value Rm, and capacitor (diode) C has junction capacitance Cd.

It is assumed that the voltage pulse output from the voltage pulse shaping circuit has a rise time or a fall time of T1, and has a maximum voltage value of Vf.

At this occasion, voltage Vm applied to both ends of resistance change element RE (resistance value Rm) at time t is obtained by solving a differential equation of the current and the voltage as follows.

Where t<T1, voltage Vm is obtained from the following equation.

[Equation 4]

$$Vm(t) = \left(1 - \exp\left(-\frac{t}{C_d R_m}\right)\right) \frac{C_d R_m}{T_1} V_f \qquad (4)$$

Where t>T1, voltage Vm is obtained from the following equation.

[Equation 5]

$$Vm(t) = \left(\exp\left(\frac{T_1}{C_d R_m}\right) - 1\right) \exp\left(-\frac{t}{C_d R_m}\right) \frac{C_d R_m}{T_1} V_f \qquad (5)$$

The maximum value of voltage Vm applied to resistance change element Rm can be reduced to 25% or less of the maximum value of the voltage V0 as shown in FIG. 24 by configuring the values as follows: T1 is set at 20 nsec, junction capacitance Cd of the diode is set at $1\times10^{-18}$ F, and the resistance value (resistance value of high resistance state) Rm of the resistance change element is set at 5 GΩ.

As a result, even when the voltage V0 is set at Vset (=V0set+Vdon+α), the maximum value of voltage Vm does not attain a value more than V0set, which prevents a write error in which the resistance change element in an unselected memory cell changes from the high resistance state to the low resistance state.

As can be understood from Equation (4) and Equation (5), maximum value Vmax of voltage Vm applied to the resistance change element is obtained from the following equation.

[Equation 6]
$$V_{max} = \left(1 - \exp\left(-\frac{T_1}{C_d R_m}\right)\right)\frac{C_d R_m}{T_1} V_f \quad (6)$$

Therefore, the effects of the embodiment can be obtained by setting rise time/fall time T1 so that maximum value Vmax given by Equation (6) does not exceed V0set.

As is evident from Equation (6), an essential parameter for determining maximum value Vmax is a ratio between rise time T1 of the voltage pulse and the product of resistance value Rm of the resistance change element and junction capacitance Cd of the diode. Where this ratio is defined as x, Equation (6) can be transformed into Vmax/Vf=(1−exp(−x))/x.

The right side is a monotonically decreasing function that yields 1 where x=0. Where x>1, the function yields a value less than 0.63, which has an effect of reducing maximum value Vmax.

In other words, when rise time/fall time T1 of the voltage pulse is set at a value more than the product of the junction capacitance of the diode and the resistance value in the high resistance state, i.e., the maximum value of the resistance value of the resistance change element, the above ratio x attains more than 1. Therefore, the effects of the embodiment can be achieved.

Now, a waveform is considered, in which the minimum value and the maximum value of the voltage pulse is constant (straight line), and the waveform changes linearly from the minimum value to the maximum value. The relationship between rise time/fall time T1 for the change from the minimum value to the maximum value and an effective rise time/effective fall time T1 according to the definition of the embodiment is represented as Ti=0.8×T1.

For example, values Ca and Ra are as follows so that effective rise time Ti does not allow maximum value Vmax given by Equation (6) to attain a value more than V0set.

Where T1 is 20 nsec, CaRa is 7.28 nsec. Accordingly, where Ca is 1 pF, Ra is set at a value equal to or more than 7.28 kΩ. Where T1 is 10 nsec, CaRa is 3.64 nsec. Accordingly, where Ca is 1 pF, Ra is set at a value equal to or more than 3.64 kΩ.

This can be derived as follows. The relationship of the effective rise time Ti=(ln 9)×(CaRa) can be obtained from Equation (4), and the relationship of Ti=0.8×T1 holds. Therefore, the relational expression, CaRa=0.8/(ln 9)×T1, holds.

D. Others

In the third embodiment, when a resistor element is used as the current limiting element in the voltage pulse shaping circuit, the resistor element may be a diffused resistor in a semiconductor substrate, or a polysilicon resistor on a semiconductor substrate.

When a P-channel MOSFET is used as the current limiting element in the voltage pulse shaping circuit, the P-channel MOSFET functions as a constant-current element in a current saturation region. Therefore, ideal waveforms can be obtained in which the rise waveform and the fall waveform are straight.

When the P-channel MOSFET is used as the current limiting element in the voltage pulse shaping circuit, the charge stored in the capacitor can be quickly discharged via the P-channel MOSFET after the writing operation. Therefore, this configuration is advantageous when the writing operation is repeated at a high speed.

Further, the resistance value of the current limiting element and the capacitance of the capacitor in the voltage pulse shaping circuit are preferably determined in view of the parasitic resistance and the parasitic capacitance of the conductive line transmitting the voltage pulse. Alternatively, the current limiting element and the capacitor in the voltage pulse shaping circuit may be constituted by only the parasitic resistance and the parasitic capacitance of the conductive line.

(4) Fourth Embodiment

The fourth embodiment is a modification of the third embodiment.

According to the mechanism of occurrence of a write error which is addressed by the embodiments, there is a possibility that a write error occurs in an unselected memory cell in which a reverse bias is applied to the diode.

Therefore, from the viewpoint of preventing the write error in unselected memory cells in each of which a reverse bias is applied to the diode, the object can be achieved by increasing only the effective rise time and the effective fall time of the voltage pulse applied to the unselected column lines.

Accordingly, in the fourth embodiment, the voltage pulse output from a voltage pulse generating circuit is given to the selected row line as in the past, but the voltage pulse output from a voltage pulse shaping circuit is given to the unselected column lines.

A. Entire Figure

FIG. 7 illustrates a resistance change memory according to the fourth embodiment.

Memory cell array 21, first decoder 22, second decoder 23, address buffer 24, control circuit 25, voltage pulse generating circuit 26, and voltage pulse shaping circuit 28 have the same configurations and functions as those of the third embodiment.

The fourth embodiment is different from the third embodiment in that the fourth embodiment does not include any voltage pulse shaping circuit connected to row lines RL1 to RLn as in the third embodiment, and in the fourth embodiment, the voltage pulse generated by voltage pulse generating circuit 26 is provided to a selected row line of row lines RL1 to RLn via first decoder 22.

When voltage pulse generating circuit 26 receives control signal CNT, voltage pulse generating circuit 26 generates a voltage pulse having a predetermined size (voltage value) and a predetermined width (duration).

The voltage pulse generated by voltage pulse generating circuit 26 is provided to the selected row line of row lines RL1 to RLn via first decoder 22.

The voltage pulse generated by voltage pulse generating circuit 26 is provided to voltage pulse shaping circuit 28 connected to unselected column lines except for the selected column line of column lines CL1 to CLm via second decoder 23.

Voltage pulse shaping circuit 28 increases the effective rise time and the effective fall time of the voltage pulse output from voltage pulse generating circuit 26.

The voltage pulse whose waveform is shaped by voltage pulse shaping circuit 28 is provided to unselected column lines of column lines CL1 to CLm.

At this occasion, the unselected row lines and the selected column line are set at a fixed voltage such as a ground voltage.

B. Partial Figure

Figure 8:
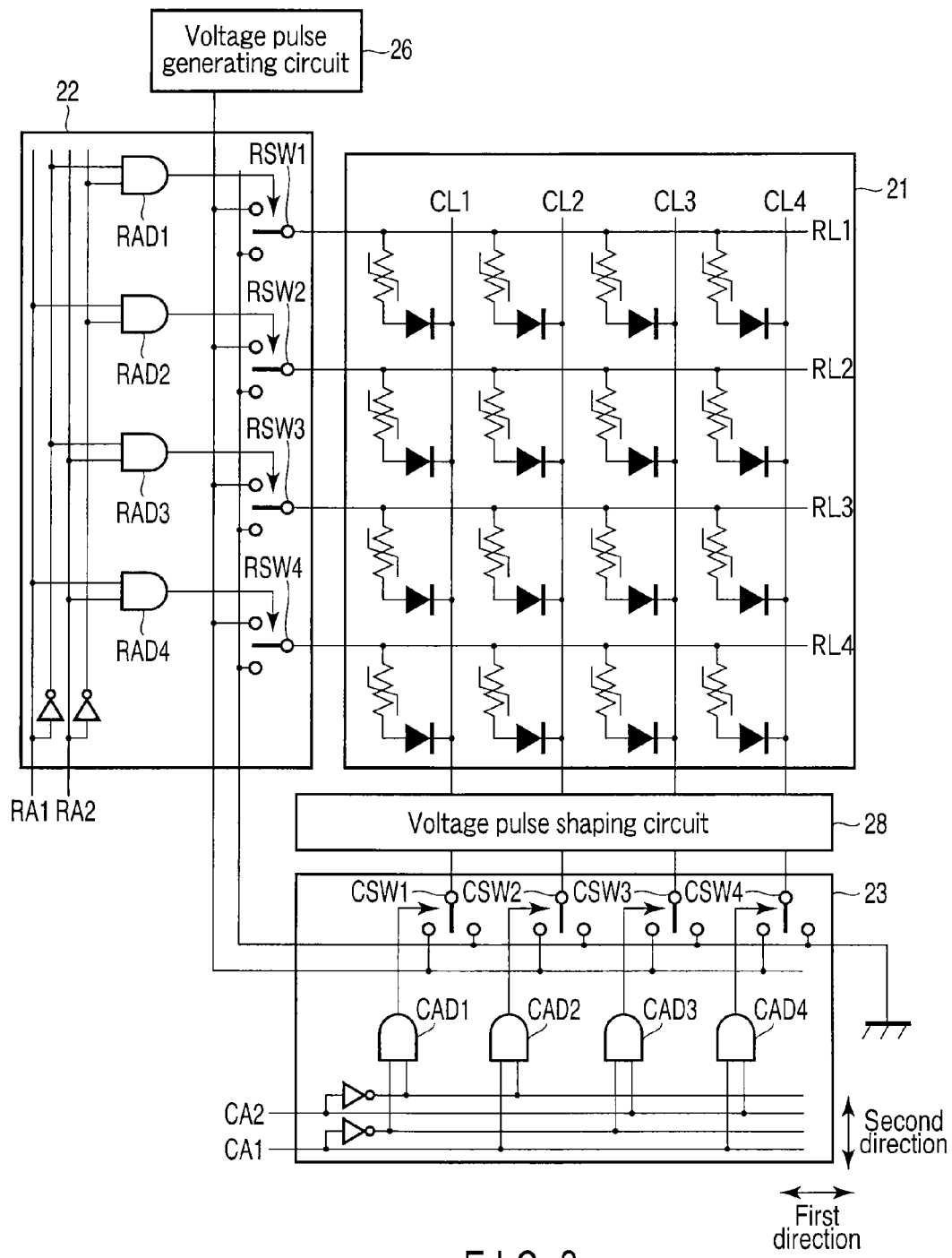

FIG. 8 illustrates an exemplary circuit including a memory cell array, a first decoder, and a second decoder in the resistance change memory of FIG. 7.

In this example, four row lines and four column lines are shown for the sake of simplifying the explanation.

In memory cell array 21, four row lines RL1, RL2, RL3, RL4 extend in the first direction, and four column lines CL1, CL2, CL3, CL4 extend in the second direction. Each memory cell is provided between one of row lines RL1, RL2, RL3, RL4 and one of column lines CL1, CL2, CL3, CL4.

The memory cell includes the resistance change element and the diode, which are connected in series.

In memory cell array 21 as described above, row lines RL1, RL2, RL3, RL4 and column lines CL1, CL2, CL3, CL4 are simply made of a line-and-space pattern. Accordingly, it is not necessary to consider displacement of these upper and lower conductive lines.

Therefore, the accuracy of positioning within memory cell array 21 may be reduced to an extremely low level, which enables easy manufacturing of memory cell array 21.

First decoder 22 is constituted by switch circuits RSW1, RSW2, RSW3, RSW4 and AND circuits RAD1, RAD2, RAD3, RAD4.

For example, switch circuits RSW1, RSW2, RSW3, RSW4 and AND circuits RAD1, RAD2, RAD3, RAD4 are CMOS circuits.

AND circuits RAD1, RAD2, RAD3, RAD4 and switch circuits RSW1, RSW2, RSW3, RSW4 operate in response to the values of address signals RA1, RA2 in the same manner as the third embodiment. Therefore, description thereof is omitted.

Second decoder 23 includes switch circuits CSW1, CSW2, CSW3, CSW4 and AND circuits CAD1, CAD2, CAD3, CAD4.

For example, switch circuits CSW1, CSW2, CSW3, CSW4 and AND circuits CAD1, CAD2, CAD3, CAD4 are CMOS circuits.

AND circuits CAD1, CAD2, CAD3, CAD4 and switch circuits CSW1, CSW2, CSW3, CSW4 operate in response to the values of address signals CA1, CA2 in the same manner as the third embodiment. Therefore, description thereof is omitted.

C. Effects

Like the third embodiment, the fourth embodiment prevents a write error.

In other words, rise time/fall time T1 is set so that maximum value Vmax given by Equation (6) of the third embodiment does not exceed V0set.

Rise time/fall time T1 of the voltage pulse is set at a value more than a product of a junction capacitance of the diode and a resistance value in a high resistance state, i.e., the maximum value of the resistance value of the resistance change element.

D. Others

The fourth embodiment may also be modified in the same manner as the third embodiment.

In the fourth embodiment, the rise time/fall time of the voltage pulse applied to the selected row line is different from the rise time/fall time of the voltage pulse applied to the unselected column lines. Therefore, during the writing operation, a sneak current may flow between one of the row lines and one of the column lines.

Because of the specification of the resistance change memory, it is preferable to employ the third embodiment when such sneak current is generated. On the other hand, when this sneak current is not generated, or when the sneak current hardly causes any problem even if it is generated, it is preferable to employ the fourth embodiment.

(5) Fifth Embodiment

Compared with the first embodiment, the fifth embodiment is characterized in the position of a voltage pulse generating/shaping circuit. In the embodiment, a voltage pulse generating/shaping circuit is arranged adjacent to memory cell array 11 so as to reduce a transmission distance of a voltage pulse and to prevent deformation of the waveform of the voltage pulse, thus stabilizing operation of the memory.

A. Entire Figure

Figure 9:
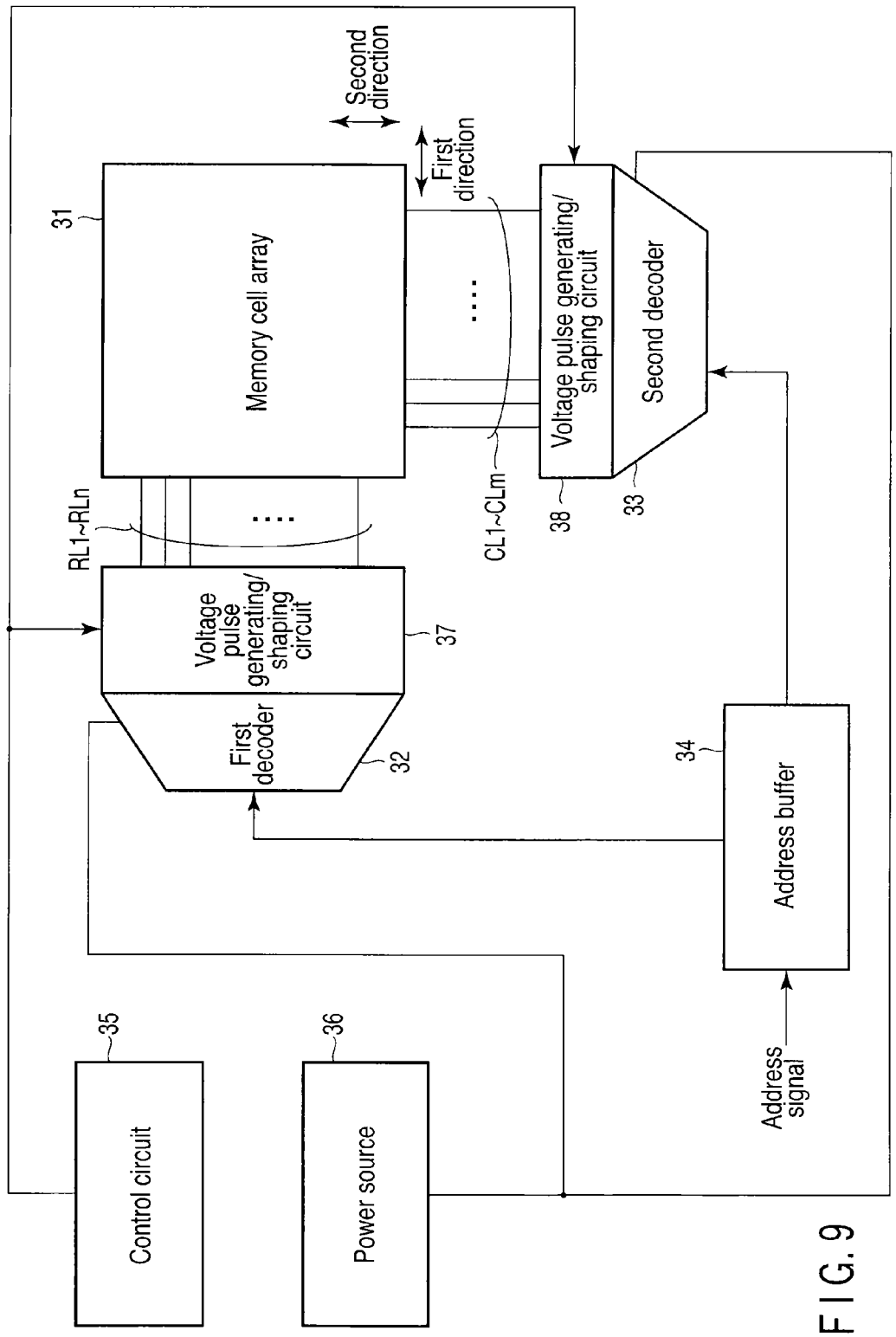

FIG. 9 illustrates a resistance change memory according to the fifth embodiment.

First decoder 32 is arranged at one end in a first direction of memory cell array 31. Second decoder 33 is arranged at one end in a second direction crossing the first direction of memory cell array 31. Row lines RL1 to RLn (n is a natural number equal to or more than 2) extend in the first direction from first decoder 32. Column lines CL1 to CLm (m is a natural number equal to or more than 2) extend in the second direction from second decoder 33.

An address signal is input to address buffer 34 during reading/writing/erasing operations. A portion of the address signal is input to first decoder 32 from address buffer 34. Another portion of the address signal is input to second decoder 33 from address buffer 34.

First decoder 32 selects one of row lines RL1 to RLn based on the address signal. Second decoder 33 selects one of column lines CL1 to CLm based on the address signal.

During the writing operation (set), control circuit 35 outputs control signal CNT which permits generation of a voltage pulse.

When voltage pulse generating/shaping circuits 37, 38 receive control signal CNT, voltage pulse generating/shaping circuits 37, 38 generates/shapes a voltage pulse having a predetermined size (voltage value) and a predetermined width (duration) with power source 36.

For example, a portion for generating a voltage pulse in each of voltage pulse generating/shaping circuits 37, 38 is constituted by a logical circuit as shown in FIG. 13. In FIG. 13, input signal IN corresponds to control signal CNT. When input signal IN changes from "L (low)" to "H (high)", the voltage pulse having the predetermined size and the predetermined width is output as output signal OUT.

For example, a portion for shaping a voltage pulse in each of voltage pulse generating/shaping circuits 37, 38 is constituted by a CR circuit (time constant circuit) as shown in FIGS. 14 and 15.

The portion for shaping the voltage pulse in each of voltage pulse generating/shaping circuits 37, 38 is configured to shape the waveform of the voltage pulse. More specifically, the portion for shaping the voltage pulse in each of voltage pulse generating/shaping circuits 37, 38 increases the effective rise time and the effective fall time of the voltage pulse output from the portion for generating the voltage pulse in each of voltage pulse generating/shaping circuits 37, 38.

A voltage pulse output from voltage pulse generating/shaping circuit 37 is provided to a selected row line of row lines RL1 to RLn. A voltage pulse output from voltage pulse generating/shaping circuit 38 is provided to unselected column lines of column lines CL1 to CLm.

At this occasion, the unselected row lines and the selected column line are set at a fixed voltage such as a ground voltage.

It is preferable that the portion for generating the voltage pulse in voltage pulse generating/shaping circuit 37 is commonly arranged for row lines RL1 to RLn. On the other hand, it is preferable that the portions for shaping the voltage pulse in voltage pulse generating/shaping circuit 37 are respectively connected to row lines RL1 to RLn.

Likewise, it is preferable that the portion for generating the voltage pulse in voltage pulse generating/shaping circuit 38 is commonly arranged for column lines CL1 to CLm. On the other hand, it is preferable that the portions for shaping the voltage pulse in voltage pulse generating/shaping circuit 38 are respectively connected to column lines CL1 to CLm.

B. Partial Figure

FIG. 10 illustrates an exemplary circuit including a memory cell array, a first decoder, and a second decoder in the resistance change memory of FIG. 9.

In this example, four row lines and four column lines are shown for the sake of simplifying the explanation.

In memory cell array 31, four row lines RL1, RL2, RL3, RL4 extend in the first direction, and four column lines CL1, CL2, CL3, CL4 extend in the second direction. Each memory cell is provided between one of row lines RL1, RL2, RL3, RL4 and one of column lines CL1, CL2, CL3, CL4.

The memory cell includes a resistance change element and a diode, which are connected in series.

In memory cell array 31 as described above, row lines RL1, RL2, RL3, RL4 and column lines CL1, CL2, CL3, CL4 are simply made of a line-and-space pattern. Accordingly, it is not necessary to consider displacement of these upper and lower conductive lines.

Therefore, the accuracy of positioning within memory cell array 31 may be reduced to an extremely low level, which enables easy manufacturing of memory cell array 31.

First decoder 32 is constituted by switch circuits RSW1, RSW2, RSW3, RSW4 and AND circuits RAD1, RAD2, RAD3, RAD4.

For example, switch circuits RSW1, RSW2, RSW3, RSW4 and AND circuits RAD1, RAD2, RAD3, RAD4 are CMOS circuits.

When both of address signals RA1, RA2 are at the "L" level, the output signal of AND circuit RAD1 attains the "H" level, and switch circuit RSW1 electrically connects row line RL1 to power source 36. At this occasion, the output signals of AND circuits RAD2, RAD3, RAD4 are at the "L" level, and switch circuits RSW2, RSW3, RSW4 fix row lines RL2, RL3, RL4 at a fixed voltage (in this case, ground voltage).

Therefore, voltage pulse generating/shaping circuit connected to row line RL1 shapes/generates the voltage pulse from power source 36, and provides the voltage pulse to row line RL1.

When address signal RA1 is at the "H" level, and address signal RA2 is at the "L" level, the output signal of AND circuit RAD2 attains the "H" level, and switch circuit RSW2 electrically connects row line RL2 to power source 36. At this occasion, the output signals of AND circuits RAD1, RAD3, RAD4 are at the "L" level, and switch circuits RSW1, RSW3, RSW4 fix row lines RL1, RL3, RL4 at the fixed voltage.

Therefore, voltage pulse generating/shaping circuit connected to row line RL2 shapes/generates the voltage pulse from power source 36, and provides the voltage pulse to row line RL2.

When address signal RA1 is at the "L" level, and address signal RA2 is at the "H" level, the output signal of AND circuit RAD3 attains the "H" level, and switch circuit RSW3 electrically connects row line RL3 to power source 36. At this occasion, the output signals of AND circuits RAD1, RAD2, RAD4 are at the "L" level, and switch circuits RSW1, RSW2, RSW4 fix row lines RL1, RL2, RL4 at the fixed voltage.

Therefore, voltage pulse generating/shaping circuit connected to row line RL3 shapes/generates the voltage pulse from power source 36, and provides the voltage pulse to row line RL3.

When both of address signals RA1, RA2 are at the "H" level, the output signal of AND circuit RAD4 attains the "H" level, and switch circuit RSW4 electrically connects row line RL4 to power source 36. At this occasion, the output signals of AND circuits RAD1, RAD2, RAD3 are at the "L" level, and switch circuits RSW1, RSW2, RSW3 fix row lines RL1, RL2, RL3 at the fixed voltage.

Therefore, voltage pulse generating/shaping circuit connected to row line RL4 shapes/generates the voltage pulse from power source 36, and provides the voltage pulse to row line RL4.

Second decoder 33 includes switch circuits CSW1, CSW2, CSW3, CSW4 and AND circuits CAD1, CAD2, CAD3, CAD4.

For example, switch circuits CSW1, CSW2, CSW3, CSW4 and AND circuits CAD1, CAD2, CAD3, CAD4 are CMOS circuits.

When both of address signals CA1, CA2 are at the "L" level, the output signal of AND circuit CAD1 attains the "H" level, and switch circuit CSW1 fixes column line CL1 at the fixed voltage (in this case, ground voltage). At this occasion, the output signals of AND circuits CAD2, CAD3, CAD4 are at the "L" level, and switch circuits CSW2, CSW3, CSW4 electrically connect column lines CL2, CL3, CL4 to power source 36.

Therefore, voltage pulse generating/shaping circuits connected to column lines CL2, CL3, CL4 shape/generate the voltage pulse from power source 36, and provide the voltage pulses to column lines CL2, CL3, CL4.

When address signal CA1 is at the "H" level, and address signal CA2 is at the "L" level, the output signal of AND circuit CAD2 attains the "H" level, and switch circuit CSW2 fixes column line CL2 at the fixed voltage. At this occasion, the output signals of AND circuits CAD1, CAD3, CAD4 are at the "L" level, and switch circuits CSW1, CSW3, CSW4 electrically connect column lines CL1, CL3, CL4 to power source 36.

Therefore, voltage pulse generating/shaping circuits connected to column lines CL1, CL3, CL4 shapes/generates the voltage pulse from power source 36, and provides the voltage pulses to column lines CL1, CL3, CL4.

When address signal CA1 is at the "L" level, and address signal CA2 is at the "H" level, the output signal of AND circuit CAD3 attains the "H" level, and switch circuit CSW3 fixes column line CL3 at the fixed voltage. At this occasion, the output signals of AND circuits CAD1, CAD2, CAD4 are at the "L" level, and switch circuits CSW1, CSW2, CSW4 electrically connect column lines CL1, CL2, CL4 to power source 36.

Therefore, voltage pulse generating/shaping circuits connected to column lines CL1, CL2, CL4 shape/generate the voltage pulse from power source 36, and provide the voltage pulses to column lines CL1, CL2, CL4.

When both of address signals CA1, CA2 are at the "H" level, the output signal of AND circuit CAD4 attains the "H" level, and switch circuit CSW4 fixes column line CL4 at the fixed voltage. At this occasion, the output signals of AND circuits CAD1, CAD2, CAD3 are at the "L" level, and switch circuits CSW1, CSW2, CSW3 electrically connect column lines CL1, CL2, CL3 to power source 36.

Therefore, voltage pulse generating/shaping circuits connected to column lines CL1, CL2, CL3 shape/generate the voltage pulse from power source 36, and provide the voltage pulses to column lines CL1, CL2, CL3.

C. Effects

Like the first embodiment, the fifth embodiment prevents a write error.

In other words, rise time/fall time T1 is set so that maximum value Vmax given by Equation (3) of the first embodiment does not exceed V0set.

Rise time/fall time T1 of the voltage pulse is set at a value more than a product of a junction capacitance of the diode and a resistance value in a high resistance state, i.e., the maximum value of the resistance value of the resistance change element.

D. Others

In the fifth embodiment, when a resistor element is used as a current limiting element in the voltage pulse generating/shaping circuit, the resistor element may be a diffused resistor in a semiconductor substrate, or a polysilicon resistor on a semiconductor substrate.

When a P-channel MOSFET is used as the current limiting element in the voltage pulse generating/shaping circuit, the P-channel MOSFET functions as a constant-current element in a current saturation region. Therefore, ideal waveforms can be obtained in which the rise waveform and the fall waveform are straight.

When the P-channel MOSFET is used as the current limiting element in the voltage pulse generating/shaping circuit, the charge stored in the capacitor can be quickly discharged via the P-channel MOSFET after the writing operation. Therefore, this configuration is advantageous when the writing operation is repeated at a high speed.

Further, the resistance value of the current limiting element and the capacitance of a capacitor in the voltage pulse generating/shaping circuit are preferably determined in view of the parasitic resistance and the parasitic capacitance of a conductive line transmitting the voltage pulse. Alternatively, the current limiting element and the capacitor in the voltage pulse shaping circuit may be constituted by only the parasitic resistance and the parasitic capacitance of the conductive line.

(6) Sixth Embodiment

The sixth embodiment is a modification of the fifth embodiment.

According to the mechanism of occurrence of a write error which is addressed by the embodiments, there is a possibility that a write error occurs in an unselected memory cell in which a reverse bias is applied to the diode.

Therefore, from the viewpoint of preventing the write error in unselected memory cells in each of which a reverse bias is applied to the diode, the object can be achieved by increasing only the effective rise time and the effective fall time of the voltage pulse applied to unselected column lines.

Accordingly, in the sixth embodiment, the voltage pulse output from a voltage pulse generating circuit is given to a selected row line as in the past, but the voltage pulse output from a voltage pulse shaping circuit is given to the unselected column lines.

A. Entire Figure

FIG. 11 illustrates a resistance change memory according to the sixth embodiment.

Memory cell array 31, first decoder 32, second decoder 33, address buffer 34, control circuit 35, power source 36, and voltage pulse generating/shaping circuit 38 have the same configurations and functions as those of the fifth embodiment.

The sixth embodiment is different from the fifth embodiment in that voltage pulse generating circuit 37' is connected to row lines RL1 to RLn, so that a voltage pulse generated by voltage pulse generating circuit 37' is provided to a selected row line of row lines RL1 to RLn.

When voltage pulse generating circuit 37' receives control signal CNT, voltage pulse generating circuit 37' generates a voltage pulse having a predetermined size (voltage value) and a predetermined width (duration).

The voltage pulse generated by voltage pulse generating circuit 37' is provided to a selected row line of row lines RL1 to RLn selected by first decoder 32.

The voltage pulse generated by voltage pulse generating/shaping circuit 38 is provided to unselected column lines of column lines CL1 to CLm except for the column line selected by second decoder 33.

The effective rise time and the effective fall time of the voltage pulse output from voltage pulse generating/shaping circuit 38 is longer than the effective rise time and the effective fall time of the voltage pulse output from voltage pulse generating circuit 37'.

At this occasion, the unselected row lines and the selected column line are set at a fixed voltage such as a ground voltage.

B. Partial Figure

Figure 12:
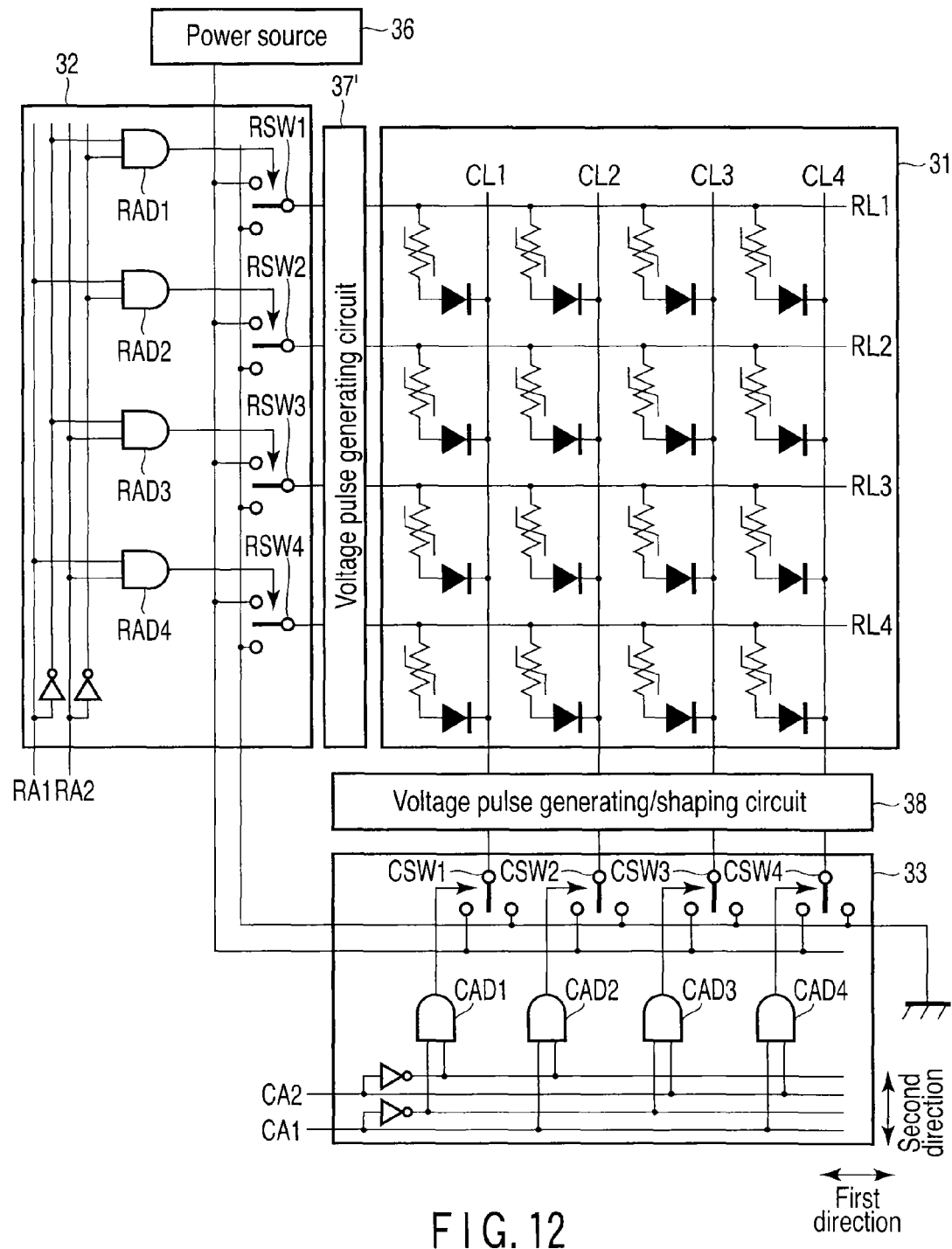

FIG. 12 illustrates an exemplary circuit including a memory cell array, a first decoder, and a second decoder in the resistance change memory of FIG. 11.

In this example, four row lines and four column lines are shown for the sake of simplifying the explanation.

In memory cell array 31, four row lines RL1, RL2, RL3, RL4 extend in the first direction, and four column lines CL1, CL2, CL3, CL4 extend in the second direction. Each memory cell is provided between one of row lines RL1, RL2, RL3, RL4 and one of column lines CL1, CL2, CL3, CL4.

The memory cell includes the resistance change element and the diode, which are connected in series.

In memory cell array 31 as described above, row lines RL1, RL2, RL3, RL4 and column lines CL1, CL2, CL3, CL4 are simply made of a line-and-space pattern. Accordingly, it is not necessary to consider displacement of these upper and lower conductive lines.

Therefore, the accuracy of positioning within memory cell array 31 may be reduced to an extremely low level, which enables easy manufacturing of memory cell array 31.

First decoder 32 is constituted by switch circuits RSW1, RSW2, RSW3, RSW4 and AND circuits RAD1, RAD2, RAD3, RAD4.

For example, switch circuits RSW1, RSW2, RSW3, RSW4 and AND circuits RAD1, RAD2, RAD3, RAD4 are CMOS circuits.

AND circuits RAD1, RAD2, RAD3, RAD4 and switch circuits RSW1, RSW2, RSW3, RSW4 operate in response to the values of address signals RA1, RA2 in the same manner as the fifth embodiment. Therefore, description thereabout is omitted.

Second decoder 33 includes switch circuits CSW1, CSW2, CSW3, CSW4 and AND circuits CAD1, CAD2, CAD3, CAD4.

For example, switch circuits CSW1, CSW2, CSW3, CSW4 and AND circuits CAD1, CAD2, CAD3, CAD4 are CMOS circuits.

AND circuits CAD1, CAD2, CAD3, CAD4 and switch circuits CSW1, CSW2, CSW3, CSW4 operate in response to the values of address signals CA1, CA2 in the same manner as the fifth embodiment. Therefore, description thereof is omitted.

C. Effects

Like the fifth embodiment, the sixth embodiment prevents a write error.

In other words, rise time/fall time T1 is set so that maximum value Vmax given by Equation (3) of the first embodiment does not exceed V0set.

Rise time/fall time T1 of the voltage pulse is set at a value more than a product of a junction capacitance of the diode and a resistance value in a high resistance state, i.e., the maximum value of the resistance value of the resistance change element.

D. Others

The sixth embodiment may also be modified in the same manner as the fifth embodiment.

In the sixth embodiment, the rise time/fall time of the voltage pulse applied to the selected row line is different from the rise time/fall time of the voltage pulse applied to the unselected column lines. Therefore, during the writing operation, a sneak current may flow between one of the row lines and one of the column lines.

Because of the specification of the resistance change memory, it is preferable to employ the fifth embodiment when such sneak current is generated. On the other hand, when this sneak current is not generated, or when the sneak current hardly causes any problem even if it is generated, it is preferable to employ the sixth embodiment.

(7) Seventh Embodiment

The seventh embodiment is a modification of the fifth embodiment.

The present embodiment is characterized in that a voltage pulse is generated by clock synchronization control in a decoder. This enables using voltage pulses having completely different lengths for row lines and column lines. Therefore, it is possible to reduce the writing time and power consumption.

A. Entire Figure

Figure 25:
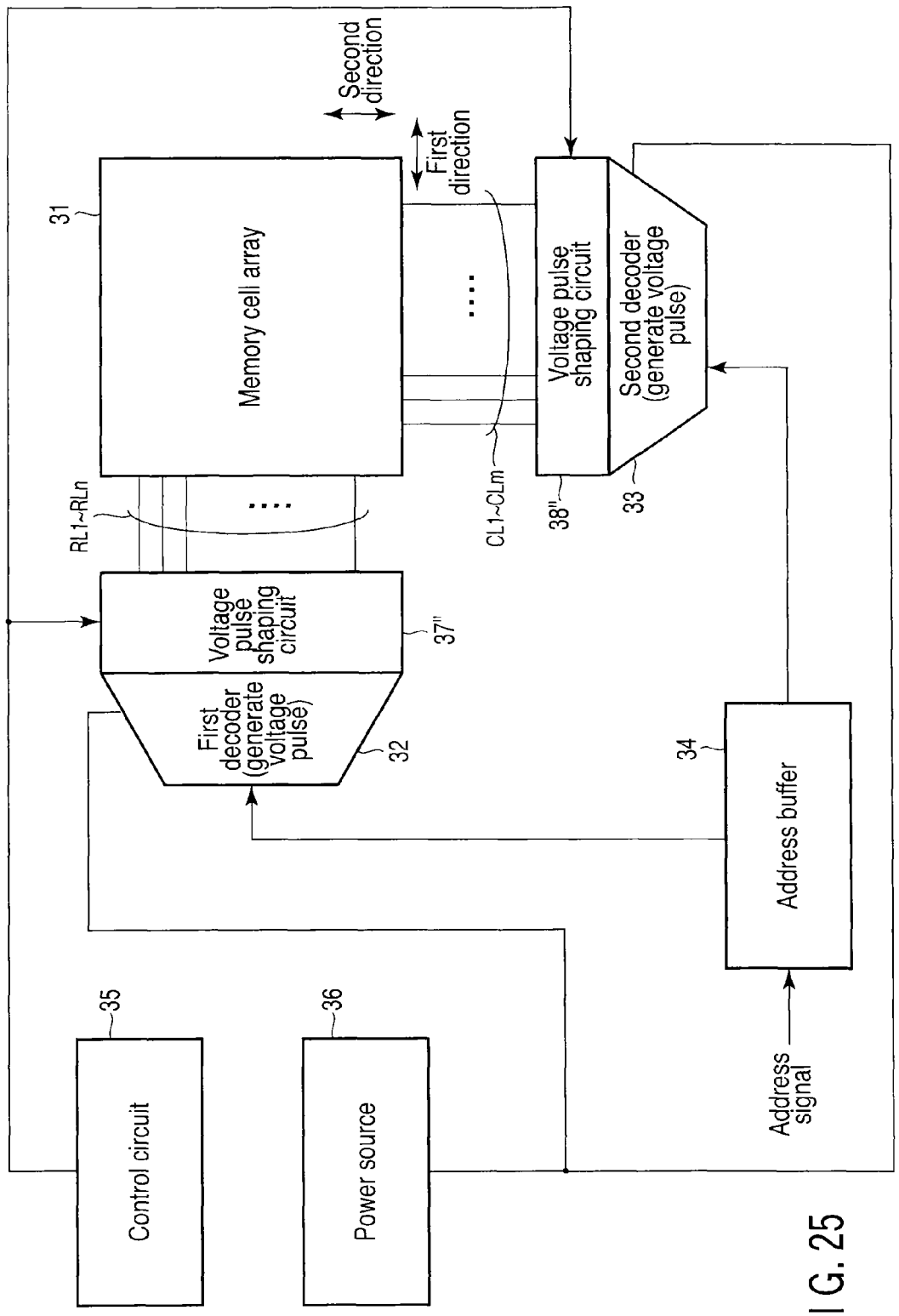
FIGS. 25 and 26 show a seventh embodiment.

FIG. 25 illustrates a resistance change memory according to the seventh embodiment.

Memory cell array 31, first decoder 32, second decoder 33, address buffer 34, control circuit 35, power source 36, and voltage pulse shaping circuits 37", 38" have the same configurations and functions as those of the fifth embodiment.

The seventh embodiment is different from the fifth embodiment in that voltage pulse shaping circuits 37", 38" are connected instead of voltage pulse generating/shaping circuits as in the fifth embodiment, and voltage pulses are generated in first decoder 32 and second decoder 33.

When first decoder 32 receives a control signal, first decoder 32 synchronizes with a clock, and generates a voltage signal provided to row lines RL1 to RLn as a voltage pulse string having a predetermined size (voltage value) and a predetermined width (duration) at a predetermined time.

Voltage pulse shaping circuit 37" increases the effective rise time and the effective fall time of each pulse of the voltage pulse string generated by first decoder 32.

The voltage pulse string shaped by voltage pulse shaping circuit 37" is provided to row lines RL1 to RLn.

When second decoder 33 receives a control signal, second decoder 33 synchronizes with a clock, and generates a voltage signal provided to column lines CL1 to CLm as a voltage pulse string having a predetermined size (voltage value) and a predetermined width (duration) at a predetermined time.

Voltage pulse shaping circuit 38" increases the effective rise time and the effective fall time of each pulse of the voltage pulse string generated by second decoder 33.

The voltage pulse string shaped by voltage pulse shaping circuit 38" is provided to column lines CL1 to CLm.

B. Partial Figure

Figure 26:
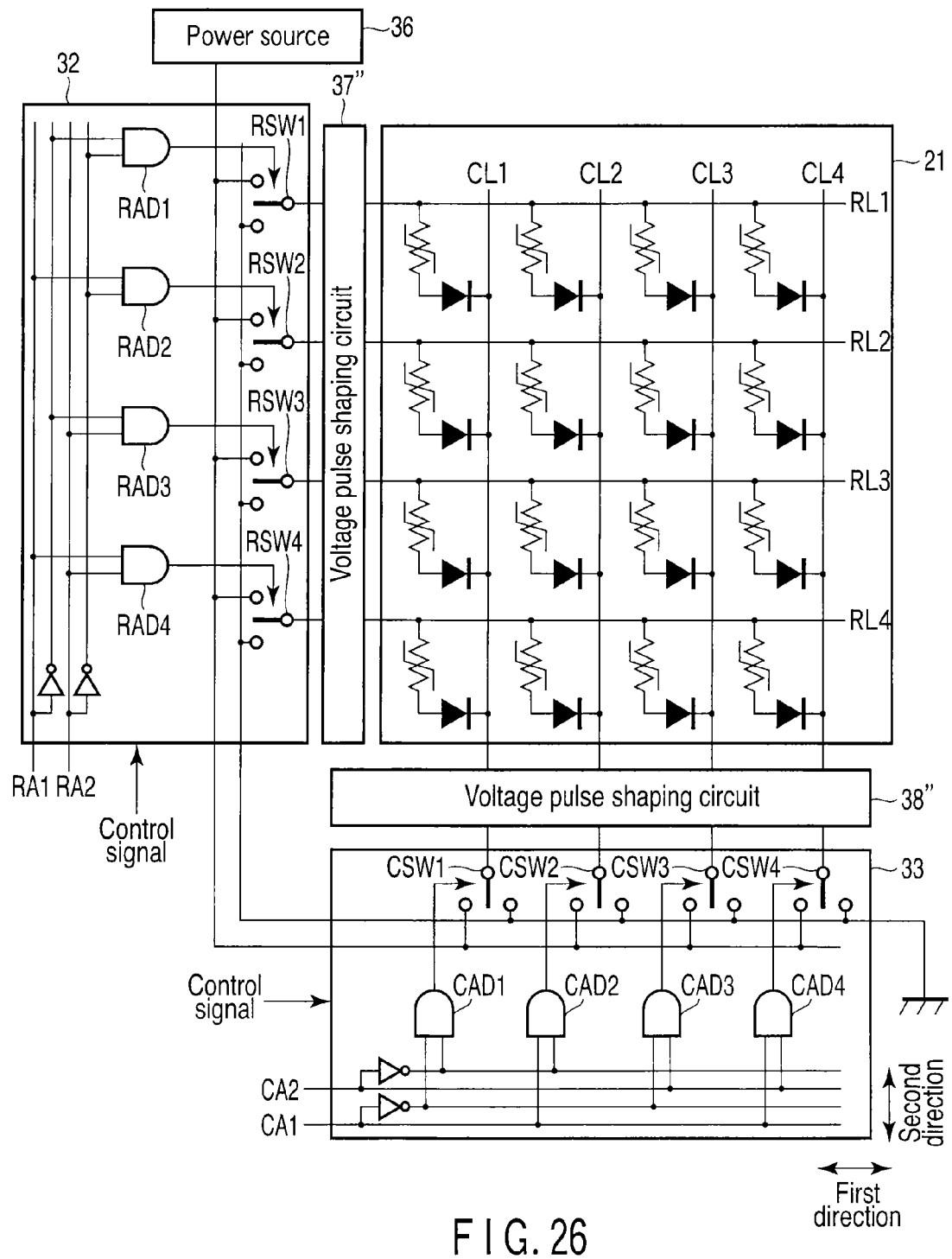

FIG. 26 illustrates an exemplary circuit including a memory cell array, a first decoder, and a second decoder in the resistance change memory of FIG. 25.

In this example, four row lines and four column lines are shown for the sake of simplifying the explanation.

In memory cell array 31, four row lines RL1, RL2, RL3, RL4 extend in the first direction, and four column lines CL1, CL2, CL3, CL4 extend in the second direction. Each memory cell is provided between one of row lines RL1, RL2, RL3, RL4 and one of column lines CL1, CL2, CL3, CL4.

The memory cell includes the resistance change element and the diode, which are connected in series.

In memory cell array 31 as described above, row lines RL1, RL2, RL3, RL4 and column lines CL1, CL2, CL3, CL4 are simply made of a line-and-space pattern. Accordingly, it is not necessary to consider displacement of these upper and lower conductive lines.

Therefore, the accuracy of positioning within memory cell array 31 may be reduced to an extremely low level, which enables easy manufacturing of memory cell array 31.

First decoder 32 is constituted by switch circuits RSW1, RSW2, RSW3, RSW4 and AND circuits RAD1, RAD2, RAD3, RAD4.

For example, switch circuits RSW1, RSW2, RSW3, RSW4 and AND circuits RAD1, RAD2, RAD3, RAD4 are CMOS circuits.

AND circuits RAD1, RAD2, RAD3, RAD4 and switch circuits RSW1, RSW2, RSW3, RSW4 operate in response to the values of address signals RA1, RA2 in the same manner as the fifth embodiment. Therefore, description thereof is omitted.

In the present embodiment, however, switch circuits RSW1, RSW2, RSW3, RSW4 operate in synchronization with the clock, and the outputs are directly generated as voltage pulse strings each having the predetermined size (voltage value) and the predetermined width (duration) at a predetermined time.

Second decoder 33 includes switch circuits CSW1, CSW2, CSW3, CSW4 and AND circuits CAD1, CAD2, CAD3, CAD4.

For example, switch circuits CSW1, CSW2, CSW3, CSW4 and AND circuits CAD1, CAD2, CAD3, CAD4 are CMOS circuits.

AND circuits CAD1, CAD2, CAD3, CAD4 and switch circuits CSW1, CSW2, CSW3, CSW4 operate in response to the values of address signals CA1, CA2 in the same manner as the fifth embodiment. Therefore, description thereof is omitted.

In the present embodiment, however, switch circuits RSW1, RSW2, RSW3, RSW4 operate in synchronization with the clock, and the outputs are directly generated as voltage pulse strings each having the predetermined size (voltage value) and the predetermined width (duration) at a predetermined time.

Further, the seventh embodiment is characterized in that the voltage pulse is generated by clock synchronization control in the decoder. Therefore, it is not necessary to particularly prepare the voltage pulse generating circuit as shown in FIG. 13, for example. Moreover, it is not necessary to provide pulses having the same length to the row lines and the column lines as shown in FIG. 18 or FIG. 20. By directly controlling the output of the decoder in a pulse form, voltage pulses having completely different lengths can be used for row lines and column lines. Therefore, the pulses can be drive as shown in a timing chart of FIG. 27.

Figure 27:
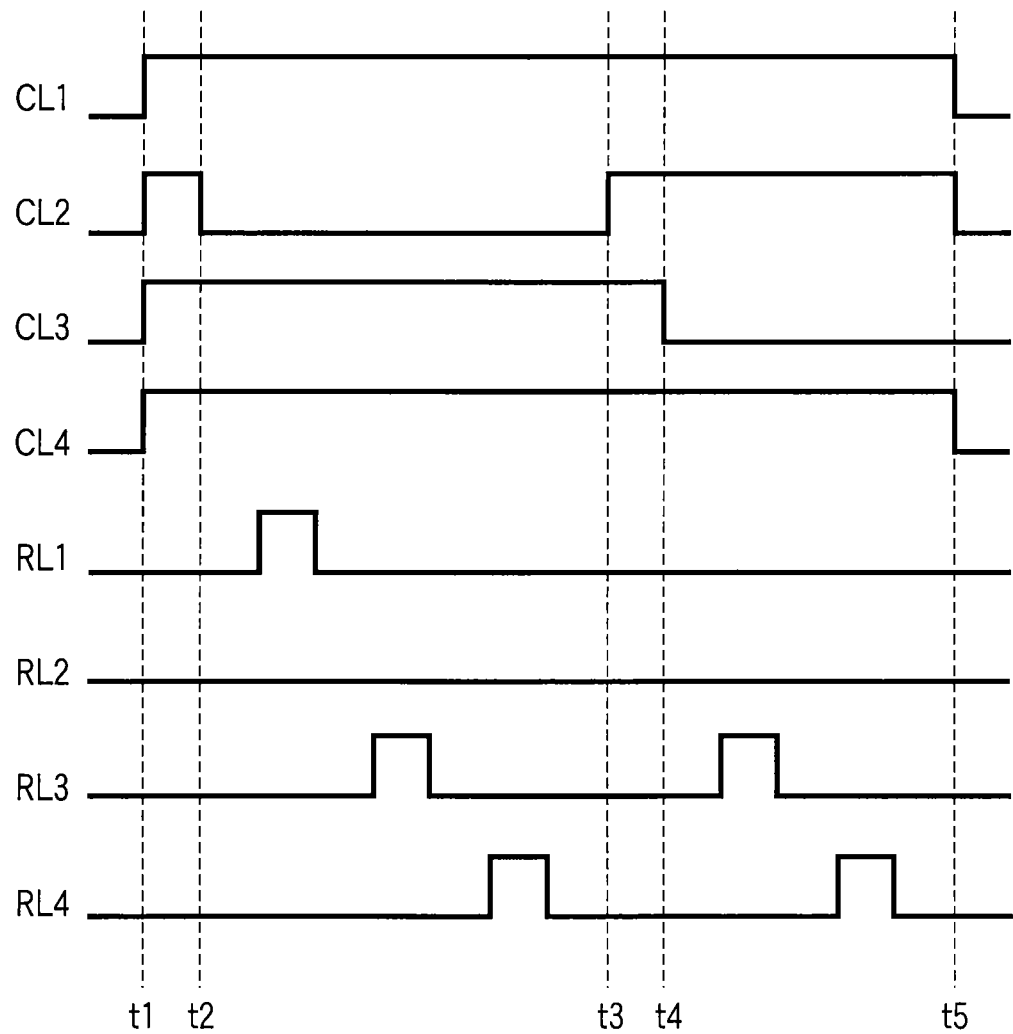
FIG. 27 shows a timing chart in data writing.

In FIG. 27, when all the column lines CL1, CL2, CL3, CL4 attain the "H" level at time t1, the memory cell array attains an address column selection preparation state. Subsequently, selected column line CL2 attains the "L" level at time t2, at which the memory cell array attains an access preparation state to bits on column line CL2. In this state, pulses are successively output so as to render a desired line of row lines RL1, RL2, RL3, RL4 at the "H" level, thus performing the writing operation to each intersecting point on the column line CL2. In the example of FIG. 27, the writing operation is performed to each of intersecting points between CL2 and RL1, RL3, RL4.

Subsequently, when the selected column line CL2 attains the "H" level again at time t3, the memory cell array attains the address column selection preparation state in which no column line is selected. Subsequently, selected column line CL3 attains the "L" level at time t4, at which the memory cell array attains an access preparation state to bits on column line CL3. In this state, pulses are successively output so as to render a desired line of row lines RL1, RL2, RL3, RL4 at the "H" level, thus performing the writing operation to each intersecting point on the column line CL3. In the example of FIG. 27, the writing operation is performed to each of intersecting points between CL3 and RL3, RL4.

Then, at time t5, all column lines CL1, CL2, CL3, CL4 attain the "L" level, at which the memory cell array attains an access halt state.

C. Effects

Like the fifth embodiment, the seventh embodiment prevents a write error.

In other words, rise time/fall time T1 is set so that maximum value Vmax given by Equation (3) of the first embodiment does not exceed V0set.

Rise time/fall time T1 of the voltage pulse is set at a value more than a product of a junction capacitance of the diode and a resistance value in a high resistance state, i.e., the maximum value of the resistance value of the resistance change element.

Further, in the present embodiment, the voltage pulse is generated by clock synchronization control in the decoder. Accordingly, voltage pulses having completely different lengths can be used for row lines and column lines. Therefore, for example, as shown in the timing chart of FIG. 27, it is not necessary to charge/discharge a column line every time bits provided at intersecting points are accessed, and this enables reducing the writing time and power consumption.

D. Others

The seventh embodiment may also be modified in the same manner as the fifth embodiment.

In the seventh embodiment, one of column lines is selected, and the intersecting points on this selected column line are successively accessed. Thereafter, a subsequent column line is selected. However, this order may be opposite. More specifically, one of row lines may be selected, and subsequently, column lines may be successively selected, so that the intersecting points on this selected row line may be successively selected, and thereafter, a subsequent row line may be selected.

4. Application Example

Figure 22:
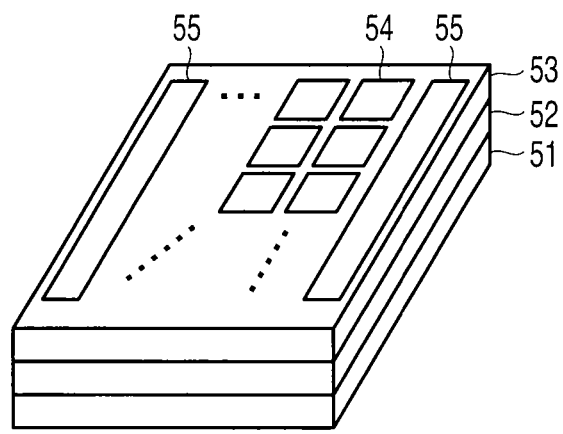
FIG. 22 shows an application example.

FIG. 22 is a perspective view illustrating a resistance change memory as an example of application.

CMOS layer 52 including CMOS circuits is formed on semiconductor substrate (such as silicon substrate) 51, and memory cell layer 53 including memory cells is formed on CMOS layer 52.

Reference numeral 54 denotes a memory cell array area. Reference numeral 55 denotes an input/output (I/O) area. Peripheral circuits are formed in CMOS layer 52.

CMOS circuit is formed with a wider pitch, e.g., 90 nm design rule, than a pitch of row lines and column lines in memory cell layer 53 except for connection portions with the memory cells. The size of the memory cell array area is, for example, 22 µm×22 µm, in which area 512×512 memory cells (intersecting points between row lines and column lines) are formed.

Memory cell array area 54 is called a block. Multiple blocks are arranged in a matrix form.

CMOS layer 52 and memory cell layer 53 are connected with each other via through-holes.

In the resistance change memory as described above, memory cell layer 53 can be formed on CMOS layer 52. The resistance change memory is not limited to having only one memory cell layer 53. It may have multiple memory cell layers 53. Therefore, a large memory capacity can be ensured without increasing the size of the chip area.

Input/output area 55 includes pads formed thereon. In an assembly step, lead frames and the pads are connected with, e.g., bonding wires.

The resistance change element constituting the memory cell is made of one material selected from the group consisting of $ZnMn_2O_4$, $NiO$, $TiO_2$, $SrZrO_3$, $Pr_{0.7}Ca_{0.3}MnO_3$.

An electrode coming into contact with the resistance change element is made of TiN or TaN. An electrode coming into contact with the resistance change element may be $TiO_2$ doped with Pt, W, WN, Nb.

The diode connected in series with the resistance change element may be a PN-junction diode formed with silicon monocrystal. Alternatively, it may be made of a PN-junction diode formed of SiGe alloy, Schottky diode, and the like.

For example, when the resistance change element is made of $ZnMn_2O_4$ having a thickness of 15 nm, one end of the resistance change element is connected to a row line made of W via an electrode made of TaN. The other end of the resistance change element is connected to a P layer (anode layer) of a PN-junction diode via an electrode made of TiN. An N layer (cathode) of the PN-junction diode is connected to a column line made of W via an electrode made of TiN.

Each of the pitch of row lines and the pitch of column lines is 44 nm, i.e., it is constituted by a line having a line width of 22 nm and a space of 22 nm. The planar size of the resistance change element is, for example, 22 nm×22 nm.

5. Conclusion

According to the embodiment, a write error in unselected memory cells is prevented during the writing operation. Moreover, the manufacturing of the resistance change memory is facilitated, and a high degree of reliability and a lower cost can be achieved.

This embodiment is effective for resistance change memories such as ReRAM using resistance change elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
first lines extending in a first direction;
second lines extending in a second direction crossing the first direction;

memory cells each including a resistance change element, and each provided between one of the first lines and one of the second lines; and a control circuit configured to:

generate a first voltage pulse using a power source, apply a second voltage pulse to one of the first lines, the second voltage pulse having a rise time longer than a rise time of the first voltage pulse, and apply a first potential to an one of the second lines.

2. The memory of claim 1, wherein the first lines are row lines, and the second lines are column lines.

3. The memory of claim 1, wherein the control circuit is configured to apply the first potential to the one of second lines after applying a second potential to the one of second lines, the first potential lower than the second potential.

4. The memory of claim 1, wherein the second voltage pulse has a fall time longer than a fall time of the first voltage pulse.

5. The memory of claim 1, wherein the rise time of the second voltage is long according to a parasitic resistance and a parasitic capacitance of some of the first lines or the second lines.

6. The memory of claim 1, wherein each of memory cells includes a diode with an anode and a cathode, the anode of the diode provided in a side of the resistance change element, the cathode of the diode provided in a side of the second lines.

7. The memory of claim 1, wherein the second voltage pulse is applied to the one of the first lines and the first potential is applied to the one of second lines in a write operation.

8. A resistance change memory comprising:

first lines extending in a first direction;

second lines extending in a second direction crossing the first direction;

memory cells each including a resistance change element, and each provided between one of the first lines and one of the second lines; and a control circuit configured to:

generate a first voltage pulse using a power source, apply a second voltage pulse to one of the first lines, the second voltage pulse having a fall time longer than a fall time of the first voltage pulse, and apply a first potential to an one of the second lines.

9. The memory of claim 8, wherein the first lines are row lines, and the second lines are column lines.

10. The memory of claim 8, wherein the control circuit is configured to apply the first potential to the one of second lines after applying a second potential to the one of second lines, the first potential lower than the second potential.

11. The memory of claim 8, wherein the fall time of the second voltage is long according to a parasitic resistance and a parasitic capacitance of some of the first lines or the second lines.

12. The memory of claim 8, wherein each of memory cells includes a diode with an anode and a cathode, the anode of the diode provided in a side of the resistance change element, the cathode of the diode provided in a side of the second lines.

13. The memory of claim 8, wherein the second voltage pulse is applied to the one of the first lines and the first potential is applied to the one of second lines in a write operation.

14. A resistance change memory comprising:

first lines extending in a first direction;

second lines extending in a second direction crossing the first direction;

memory cells each including a resistance change element, and each provided between one of the first lines and one of the second lines; and a control circuit configured to:

apply a first voltage pulse having a rise time from 10 nsec to 20 nsec to one of the first lines, and apply a first potential to an one of the second lines.

15. The memory of claim 14, wherein the rise time is a time from when a voltage value of the first voltage pulse attains a value obtained by adding 10% of a voltage difference between the minimum value and the maximum value to the minimum value, to when a voltage value of the first voltage pulse attains a value obtained by subtracting 10% of the voltage difference between the minimum value and the maximum value from the maximum value.

16. The memory of claim 14, wherein the first lines are row lines, and the second lines are column lines.

17. The memory of claim 14, wherein the control circuit is configured to apply the first potential to the one of second lines after applying a second potential to the one of second lines, the first potential lower than the second potential.

18. The memory of claim 14, wherein the control circuit is configured to apply the first voltage pulse having a fall time is from 10 nsec to 20 nsec to one of the first lines.

19. The memory of claim 18, wherein the fall time is a time from when a voltage value of the first voltage pulse attains a value obtained by subtracting 10% of a voltage difference between the minimum value and the maximum value from the maximum value, to when a voltage value of the first voltage pulse attains a value obtained by adding 10% of the voltage difference between the minimum value and the maximum value to the minimum value.

20. The memory of claim 14, wherein each of memory cells includes a diode with an anode and a cathode, the anode of the diode provided at a side of the resistance change element, the cathode of the diode provided at a side of the second lines.

21. The memory of claim 14, wherein the first voltage pulse is applied to the one of the first lines and the first potential is applied to the one of second lines in a write operation.

22. A resistance change memory comprising:

first lines extending in a first direction;

second lines extending in a second direction crossing the first direction;

memory cells each including a resistance change element, and each provided between one of the first lines and one of the second lines; and a control circuit configured to:

apply a first voltage pulse having a fall time which is from 10 nsec to 20 nsec to one of the first lines, and apply a first potential to an one of the second lines.

23. The memory of claim 22, wherein the fall time is a time from when a voltage value of the first voltage pulse attains a value obtained by subtracting 10% of a voltage difference between the minimum value and the maximum value from the maximum value, to when a voltage value of the first voltage pulse attains a value obtained by adding 10% of the voltage difference between the minimum value and the maximum value to the minimum value.

24. The memory of claim 22,
wherein the first lines are row lines, and the second lines are column lines.

25. The memory of claim 22,
wherein the control circuit is configured to apply the first potential to the one of second lines after applying a second potential to the one of second lines, the first potential lower than the second potential.

26. The memory of claim 22,
wherein each of memory cells includes a diode with an anode and a cathode, the anode of the diode provided at a side of the resistance change element, the cathode of the diode provided at a side of the second lines.

27. The memory of claim 22,
wherein the first voltage pulse is applied to the one of the first lines and the first potential is applied to the one of second lines in a write operation.

* * * * *